(12) United States Patent
Kameyama et al.

(10) Patent No.: US 8,970,124 B2
(45) Date of Patent: Mar. 3, 2015

(54) FIELD EQUIPMENT PHOTOELECTRIC SENSING SENSITIVITY ADJUSTMENT

(75) Inventors: Tatsumi Kameyama, Tokyo (JP); Noriaki Nakayama, Tokyo (JP); Yoshifumi Endo, Tokyo (JP)

(73) Assignee: Oval Corporation, Tokyo (JP)

( * ) Notice: Subject to any disclaimer, the term of this patent is extended or adjusted under 35 U.S.C. 154(b) by 231 days.

(21) Appl. No.: 13/376,905

(22) PCT Filed: Oct. 4, 2010

(86) PCT No.: PCT/JP2010/067713
§ 371 (c)(1),
(2), (4) Date: Dec. 8, 2011

(87) PCT Pub. No.: WO2011/043452
PCT Pub. Date: Apr. 14, 2011

(65) Prior Publication Data
US 2012/0081031 A1   Apr. 5, 2012

(30) Foreign Application Priority Data

Oct. 10, 2009  (JP) .................................. 2009-235810

(51) Int. Cl.
*H05B 37/02* (2006.01)
*H05B 33/08* (2006.01)
*H03K 17/94* (2006.01)

(52) U.S. Cl.
CPC ........ *H05B 33/0809* (2013.01); *H05B 33/0845* (2013.01); *H03K 17/941* (2013.01); *H05B 33/0815* (2013.01); *H03K 2217/94031* (2013.01)
USPC ........... 315/291; 315/308; 315/312; 315/362; 250/205

(58) Field of Classification Search
USPC ......... 315/149–151, 158, 291–293, 112, 224, 315/308, 312–313, 318, 362; 250/205, 221, 250/222.1, 201.4; 340/13.24, 539.26
See application file for complete search history.

(56) References Cited

U.S. PATENT DOCUMENTS

| | | | | |
|---|---|---|---|---|
| 5,758,644 A | * | 6/1998 | Diab et al. | 600/323 |
| 7,244,917 B2 | * | 7/2007 | Tsukigi et al. | 250/205 |
| 7,983,729 B2 | * | 7/2011 | Mannheimer et al. | 600/323 |

FOREIGN PATENT DOCUMENTS

| | | |
|---|---|---|
| JP | 10-303722 | 11/1998 |
| JP | 2002-318286 | 10/2002 |

(Continued)

OTHER PUBLICATIONS

International Search Report issued Nov. 16, 2010 in International (PCT) Application No. PCT/JP2010/067713.

*Primary Examiner* — Thienvu Tran
*Assistant Examiner* — Christopher Lo
(74) *Attorney, Agent, or Firm* — Wenderoth, Lind & Ponack, L.L.P.

(57) ABSTRACT

A photoelectric sensing sensitivity adjusting device includes: an LED for emitting light by being supplied with energy (current or voltage); a regulator for LED driving for supplying the energy to the LED; a light receiving device for receiving the light emitted from the LED; a digital potentiometer for controlling increase or decrease of the energy to be supplied to the LED; a CPU for digitally controlling, according to a control program, the increase or decrease of the energy to be supplied to the LED; and a photodetection portion for detecting an optical signal, converting the optical signal to an electrical signal, and outputting the electrical signal.

20 Claims, 12 Drawing Sheets

(56) References Cited

FOREIGN PATENT DOCUMENTS

| JP | 2003-37563 | 2/2003 |
| JP | 3529201 | 5/2004 |
| JP | 2005-221251 | 8/2005 |
| JP | 2006-234526 | 9/2006 |

* cited by examiner

FIELD EQUIPMENT PHOTOELECTRIC SENSING SENSITIVITY ADJUSTMENT

CROSS-REFERENCE TO RELATED APPLICATIONS

It is noted that the application claims priority from PCT/JP2010/067713 filed on Oct. 4, 2010 and Japanese Patent Application No. 2009-235810 filed on Oct. 10, 2009.

TECHNICAL FIELD

The present invention relates to a setting operation portion to be provided to a field device, and more particularly, to a photoelectric sensing sensitivity adjusting device for a field device, which adjusts photoelectric sensing (optical switch) detection sensitivity of an optical switch for switching a setting content, and also to a method therefor.

BACKGROUND ART

The term "field device" collectively refers to such measuring instruments as various flowmeters, temperature measuring instruments, and pressure measuring instruments, and also refers to control instruments, valves, and the like, which are mainly used in, for example, plant facilities or factory facilities, regardless of indoors or outdoors.

As a typical field device, there exists a flowmeter for measuring the flow rate of a fluid flowing through a pipe of a plant, or a batch counter (pre-set counter) for controlling, with a combination of a flowmeter and a valve, the operation of the valve based on a flow rate signal from the flowmeter.

Further, many of those instruments are provided with a display portion or an operation portion for making various settings through a view of the display portion.

Examples of the flowmeter, which is one kind of the field device, include a positive displacement flowmeter and a Coriolis flowmeter. The positive displacement flowmeter generally includes a measuring chamber having a rotor, which rotates in proportion to the volume of a fluid to be measured flowing through a flow tube, provided therein, and determines the flow rate based on the rotation of the rotor rotating in proportion to the volume of the fluid to be measured flowing into the measuring chamber. The Coriolis flowmeter is a mass flowmeter in which one end or both ends of a flow tube through which a fluid to be measured is flowing are supported, and which utilizes a fact that a mass flow rate is proportional to a Coriolis force acting on the flow tube (which is a tube in which oscillation is to be generated) when oscillation is generated in a direction perpendicular to a flow direction of the flow tube with the supported points being fixed.

The positive displacement flowmeter is commonly known as in the technology disclosed in, for example, JP 3529201 B2. Further, the Coriolis flowmeter, which is a mass flowmeter, is commonly known as in the technology disclosed in, for example, JP 2005-221251 A.

The positive displacement flowmeter disclosed in JP 3529201 B2 has a counter built in a casing structured by a casing main body and a cover. The casing is separately structured from the counter. The flow rate calculated by the counter is displayed as a numerical value on an LCD indicator provided to the counter. The flow rate displayed on the LCD indicator can be visually recognized through a window of the cover.

When or after the positive displacement flowmeter is mounted to a predetermined position of a pipe, the direction of the counter is adjusted so that the front surface of the counter (specifically, the front surface of the counter housing) can be viewed from the upright direction of the front surface. When the positive displacement flowmeter disclosed in JP 3529201 B2 is mounted, the adjustment is performed as well so that the front surface of the counter can be viewed from the upright direction thereof through the window of the cover.

Further, as is widely known, the Coriolis flowmeter is a mass flowmeter in which one end or both ends of a flow tube through which a fluid to be measured is flowing are supported, and which utilizes the fact that a mass flow rate is proportional to a Coriolis force acting on the flow tube (which is a tube in which oscillation is to be generated) when oscillation is generated in a direction perpendicular to a flow direction of the flow tube with the supported points being fixed. The shape of the flow tube in the Coriolis flowmeter is classified into two major types of a straight tube type and a U-shaped tube type.

As described above, the Coriolis flowmeter is a mass flowmeter in which a flow tube, through which a fluid to be measured flows, is supported at both ends thereof, and when a central portion of the supported flow tube is alternately driven in a direction perpendicular to a support line, a phase difference signal proportional to a mass flow rate is detected between the supported portions positioned at symmetric positions of the flow tube at its both ends with respect to the central portion.

Then, when the frequency for alternately driving the flow tube is made equal to the eigen frequency of the flow tube, a constant drive frequency can be obtained according to the density of the fluid to be measured, which enables driving the flow tube with small drive energy. Accordingly, in recent years, it has been a common practice to drive the flow tube at the eigen frequency. The phase difference signal is proportional to the mass flow rate, but assuming that a drive frequency is constant, the phase difference signal can be detected as a time difference signal between observation positions of the flow tube.

In recent years, the field device has been provided with a feature that the settings thereof can be changed on the spot through touch operation.

With the provision of a non-contact switching device (SW) employing photoelectric sensing, the setting operation for the field device is performed on the spot through the touch operation on a light-emitter-beam transmissive material (for example, glass).

The principle of an optical switch, which is a non-contact switching device (SW) employing optical sensing, is as follows. That is, the optical switch performs switching (SW operation) by being turned on or off when light emitted from a light emitter such as an LED has been received by a photodetector such as a commercially available photo IC, or being turned off or on when light emitted from the light emitter such as an LED has ceased to be received by the photodetector such as a photo IC.

The non-contact switching device (SW) described above generally has such a configuration as illustrated in FIG. 11. Specifically, a non-contact switching device (SW) 500 includes a light emitter (for example, LED) 510 and a photodetector (for example, commercially available photo IC) 520, and the light emitter (for example, LED) 510 and the photodetector (for example, photo IC) 520 are each surrounded by a light blocking structure 530. The light emitter (for example, LED) 510 and the photodetector (for example, photo IC) 520 are disposed in an isolated manner so that light emitted from the light emitter (for example, LED) 510 does not directly enter the photodetector (for example, photo IC) 520.

Above the light emitter (for example, LED) 510 surrounded by the light blocking structure 530, there is formed an opening 531 so that light emitted from the light emitter (for example, LED) 510 is emitted upward from inside the light blocking structure 530. Further, above the photodetector (for example, photo IC) 520 surrounded by the light blocking structure 530, there is formed an opening 532 so that the light emitted from the light emitter (for example, LED) 510 enters the light blocking structure 530 from a predetermined direction after being reflected by a light reflector.

A top side of the light blocking structure 530 is covered with a light-emitter-beam transmissive material (for example, glass) 540. Thus, the light-emitter-beam transmissive material (for example, glass) 540 serves as a top cover of the light blocking structure 530, and corresponds to a glass cover portion of a setting device portion of a housing of the field device.

In the optical switch 500 having the above-mentioned configuration, light is constantly emitted from the light emitter (for example, LED) 510, and the light emitted from the light emitter (for example, LED) 510 is emitted from the opening 531 formed above the light blocking structure 530. Further, the photodetector (for example, photo IC) 520 is capable of constantly receiving the incident light from the opening 532 formed above the light blocking structure 530.

In such a state, when a light reflector (detection object) 550, such as a finger, is put over the light-emitter-beam transmissive material (for example, glass) 540, the light emitted from the light emitter (for example, LED) 510 and then from the opening 531 formed above the light blocking structure 530 is reflected by the light reflector (detection object) 550, such as a finger, which has been put over the light-emitter-beam transmissive material (for example, glass) 540, and is then caused to enter the opening 532 formed above the light blocking structure 530, with the result that the light is received by the photodetector (for example, photoreflector) 520.

With this, the switch is turned on. This switch on enables the settings or the like of the field device to be changed.

Specifically, the light emitter (for example, LED) 510 is installed with an emitting angle thereof set so that, when the light reflector (detection object) 550, such as a finger, is put over the light-emitter-beam transmissive material (for example, glass) 540, the light emitted from the light emitter (for example, LED) 510 and then from the opening 531 formed above the light blocking structure 530 is reflected by the light reflector (detection object) 550, such as a finger, and is then caused to enter through the opening 532 formed above the light blocking structure 530.

Further, the photodetector (for example, photo IC) 520 is installed with a receiving angle thereof set so that the light emitted from the light emitter (for example, LED) 510 is received after entering through the opening 532 formed above the light blocking structure 530.

Regarding such a non-contact switching device (SW) employing the photoelectric sensing, a general optical signal switching device is described in JP 2006-234526 A. JP 2006-234526 A describes an optical signal switching device which can easily set a detection distance of reflection of a light receiving element, and can prevent a malfunction. Further, with regard to the optical signal switching device of Patent Document 3, there is a description about a sensitivity adjusting circuit 22 which adjusts the detection sensitivity for a reflected wave from the light receiving element 16.

SUMMARY OF THE INVENTION

Such an optical-sensing non-contact switching device (SW) 500 does not suffer impairment of its operational function even if the entire device is covered with a light transmissive material (for example, glass, transparent plastic, etc.) because the detection target of the photodetector (for example, photo IC) 520 is light. The optical-sensing non-contact switching device (SW) 500 has an advantage that the SW operation can be performed under a condition of hermetically sealed structure without any direct touch to the device from a human being by changing the direction (directivity) or the amount of light emitted from the light emitter (for example, LED) 510.

The optical-sensing non-contact switching device (SW) 500 configured as described above performs the SW operation by receiving and detecting light. Light exists everywhere in the natural world, but, on the other hand, light is a detection medium which is difficult for a human being to grasp quantitatively in a direct manner. Thus, there is a problem of malfunction or operation failure, and, in general, various ways have been devised.

Specifically, the following ways have been devised for the optical-sensing non-contact switching device (SW) 500:
(1) the photodetector (for example, photo IC) 520 is configured to detect only a wavelength identical to the wavelength of light emitted from the light emitter (for example, LED) 510 (optical BP filter);
(2) emission light emitted from the light emitter (for example, LED) 510 is flickered at a predetermined timing, and the photodetector (for example, photo IC) 520 detects only such light that is synchronized with that timing;
(3) the level (light amount) of light to be detected by the photodetector (for example, photo IC) 520 is determined, and also, hysteresis is provided to the detection level; and
(4) surroundings of the light emitter (for example, LED) 510 and the photodetector (for example, photo IC) 520 are partially or entirely covered with the light blocking material 530 so that only the light of the detection target is emitted to the photodetector (for example, photo IC) 520.

For the adjustment of the sensitivity (response position with respect to a detection material) of the non-contact switching device (SW), for example, there are a method of adjusting the amount of light reaching the photodetector (for example, photo IC) by mainly adjusting the light amount of the light emitter, and a method of adjusting the amount of light reaching the photodetector (for example, photo IC) by changing the dimensions of the light blocking structure.

In the case of the method of adjusting the amount of light reaching the photodetector (for example, photo IC) by adjusting the light amount of the light emitter for the adjustment of the sensitivity (response position with respect to a detection material) of the non-contact switching device (SW), as means for adjusting the light amount of the light emitter, electrical energy (current/voltage) to be applied to the light emitter is adjusted by using a volume resistor.

On the other hand, in the case of the method of adjusting the amount of light reaching the photodetector (for example, photo IC) by changing the dimensions of the light blocking structure, as means for adjusting the amount of light reaching the photodetector (for example, photo IC) by means of the light blocking structure, there is provided structure in which a hole is opened in the light blocking structure and is arranged between the light emitter and the photodetector so that light passes through the hole. Thus, by enlarging or reducing the size of the hole, the amount of passing light (directivity of light) is adjusted.

Specifically, as illustrated in FIG. 12, the light emitter (for example, LED) 510 of the non-contact switching device (SW) 500 is connected to a volume resistor (variable resistor) R560, and by adjusting the volume resistor (variable resistor)

560, a given optical pulse signal is output from the light emitter (for example, LED) 510. The optical pulse signal is detected by the photodetector (for example, photo IC) 520, and is then output as an ON/OFF output signal.

Such adjustment of the sensitivity (response position with respect to a detection material) of the non-contact switching device (SW) has the following problems in the case of the method of adjusting the amount of light reaching the photodetector (for example, photo IC) by adjusting the light amount of the light emitter. Those problems are: a relatively large-scale adjusting jig is required, and it is difficult to realize automatic adjustment because the method is an adjusting method which depends on a sense of a person who performs adjustment; the entire portion in question or part thereof needs to be exposed out of the housing at the time of the adjustment; and the adjustment is difficult to perform in the case of such a field device that is covered with a sturdy housing.

Further, the same applies to the method of adjusting the amount of light reaching the photodetector (for example, photo IC) by changing the dimensions of the light blocking structure.

Further, regarding the optical signal switching device of JP 2006-234526A, as details of the sensitivity adjusting circuit 22, there is a description about performing the sensitivity adjustment by a filter circuit 21 for removing noise. However, there is no specific description about how the sensitivity adjustment is performed.

An object of the present invention is to provide such stable sensitivity adjustment for a non-contact switching device (SW) employing optical sensing that enables the amount of light of a light emitter (for example, LED) to be adjusted automatically without exposing an inside of an instrument to external air and depending on a sense of an operator.

In order to solve the above-mentioned problems, according to a first aspect of the invention, there is provided a photoelectric sensing sensitivity adjusting device of an optical-sensing non-contact switching device (SW) for a field device, capable of performing optimum sensitivity adjustment, wherein:

an operation portion (man-machine interface) of the field device is configured so as not to be exposed to external air through provision of a light-emitter-beam transmissive material (glass, or the like) to a front surface thereof;

the operation portion including:
　a switching operation portion for turning on/off a photoelectric sensor by bringing a light reflector closer to the front surface formed of the light-emitter-beam transmissive material;
　a data display screen for displaying a screen according to a switching mode designated by the switching operation portion, after a switching operation (ON operation) of the switching operation portion is performed by bringing the light reflector closer to the front surface of the operation portion to thereby switch modes of display data including a setting; and
　a photoelectric sensing sensitivity adjusting device for adjusting optical detection sensitivity of the photoelectric sensor which is turned on/off by the switching operation portion, the photoelectric sensing sensitivity adjusting device including:
　a light emitter including an LED, for emitting light by being supplied with energy (current or voltage);
　a regulator for LED driving with an output adjusting function, for supplying the energy (current or voltage) to the LED serving as the light emitter;
　a light receiving device for receiving the light which is emitted from the light emitter and reflected by bringing the light reflector closer to the front surface formed of the light-emitter-beam transmissive material;
　a digital potentiometer for controlling increase or decrease of the energy (current or voltage) to be supplied to the LED serving as the light emitter from the regulator for LED driving;
　a CPU for digitally controlling the increase or the decrease of the energy (current or voltage) to be supplied to the LED serving as the light emitter from the regulator for LED driving, by controlling the digital potentiometer according to a control program with a control signal;
　a personal computer connected via a communication terminal unit, for controlling the CPU; and
　a photodetection portion for detecting an optical signal emitted from the LED, converting the optical signal to an electrical signal, and outputting the electrical signal.

Note that, a commercially available photo IC or the like may be used as the photodetection portion, and there may be provided a photodetector which includes, as internal structure, a pulse generator for outputting a given pulse signal, and an AND circuit for outputting an AND signal obtained between the electrical signal output from the photodetection portion and the given pulse signal output from the pulse generator.

In order to solve the above-mentioned problems, according to a second aspect of the invention, there is provided a photoelectric sensing sensitivity adjusting device of an optical-sensing non-contact switching device (SW) for a field device, in which the field device of the photoelectric sensing sensitivity adjusting device of an optical-sensing non-contact switching device (SW) for a field device according to the first aspect of the invention is accommodated in a sturdy housing intended for on-site installation in consideration of durability.

In order to solve the above-mentioned problems, according to a third aspect of the invention, there is provided a photoelectric sensing sensitivity adjusting device of an optical-sensing non-contact switching device (SW) for a field device, which has an automatic sensitivity adjustment function for optical sensing including:
　a first step of resetting a current adjustment level of the commercially available digital potentiometer, which is used in the photoelectric sensing sensitivity adjusting device of an optical-sensing non-contact switching device (SW) for a field device according to the first or second aspects of the invention, to set an adjustment level of the digital potentiometer to a maximum sensitivity level;
　a second step of determining whether or not the light of the LED which is emitting the light under a state of the first step is detected by the photodetection portion provided inside a photodetector;
　a third step of outputting, when the light of the LED is detected in the second step, a signal for changing (up-shifting or down-shifting) a wiper terminal of the digital potentiometer to the digital potentiometer from the CPU via a digital control line connecting the digital potentiometer and the CPU, and setting the adjustment level of the digital potentiometer to be increased or decreased by "1" (by 1 bit);
　a fourth step of determining whether or not sensitivity of the wiper terminal of the digital potentiometer can be adjusted (up-shifted or down-shifted) to fall within an adjustment level range; and
　a fifth step of determining, when the sensitivity adjustment can be performed on the adjustment level in the fourth step, whether or not the adjustment level falls within the adjustment level range (=27 to 5) of the wiper terminal of the digital potentiometer, in which the adjusted sensitivity of the photoelectric sensor is increased in a stepwise manner, and the adjustment is ended at a level at which an output from the photodetector is changed.

In order to solve the above-mentioned problems, according to a fourth aspect of the invention, there is provided a photoelectric sensing sensitivity adjusting device of an optical-sensing non-contact switching device (SW) for a field device, in which the photoelectric sensing sensitivity adjusting device of an optical-sensing non-contact switching device (SW) for a field device according to any one of the first through third aspects of the invention has an automatic correction function for an optical switch, including:

a first step of determining whether or not a long period of time (for example, 60 minutes or longer) has successively elapsed after a state of output from the photodetector became ON;

a second step of determining that there is a malfunction when an ON state has been kept successively for the long period of time (for example, 60 minutes or longer) after the state of the output from the detector became ON in the first step, outputting a signal for changing (down-shifting) the wiper terminal to the digital potentiometer from the CPU, and setting the sensitivity adjustment level of the photodetector to be decreased by "1" level;

a third step of determining whether or not the state of the output from the photodetector is ON even after the sensitivity adjustment level of the photodetector is set to be decreased by the "1" level in the second step;

a fourth step of controlling the sensitivity adjustment level of the photodetector until the state of the output from the photodetector becomes OFF after determining in the third step that the sensitivity adjustment level of the photodetector is continuously high because the state of the output from the photodetector is ON; and a fifth step of determining, when the state of the output from the photodetector becomes OFF in the fourth step, that the sensitivity adjustment level of the photodetector has become appropriate, and ending controlling the sensitivity adjustment level of the photodetector, and in which the adjusted sensitivity of the optical switch is decreased in a stepwise manner, and the adjustment is ended at the level at which the output from the photodetector is changed, thereby automatically correcting the sensitivity adjustment of the optical switch.

In order to solve the above-mentioned problems, according to a fifth aspect of the invention, there is provided a photoelectric sensing sensitivity adjusting device of an optical-sensing non-contact switching device (SW) for a field device, capable of performing optimum sensitivity adjustment through control of a digital potentiometer by a CPU, in which:

a switching operation portion (man-machine interface) of the field device is configured so as not to be exposed to external air through provision of a light-emitter-beam transmissive material (glass, or the like) to a front surface thereof;

the switching operation portion being configured so as not to be exposed to external air with provision of a light-emitter-beam transmissive material (glass, or the like) to a front surface thereof, the switching operation portion comprising:
a switching operation portion for turning on/off a photoelectric sensor comprising a light emitter and a photodetector, by bringing a light reflector closer to the light-emitter-beam transmissive material;

a data display screen for displaying, on a screen, according to a designated mode, a mode of display data through a switching operation of the switching operation portion; and a photoelectric sensing sensitivity adjusting device adjusting optical detection sensitivity of the photoelectric sensor, the photoelectric sensing sensitivity adjusting device comprising: an LED; a photo IC; a variable output regulator; a digital potentiometer; and a CPU, in which the LED emits light by being supplied with electrical energy, in which the photo IC receives the light which is emitted from the LED and reflected by the light reflector, and outputs a signal, in which the variable output regulator has one end connected to the LED via a first resistor and another end connected to the digital potentiometer via a second resistor, and increases or decreases a forward current of the LED by changing an output voltage, to thereby adjust a light emission amount of the LED, in which the digital potentiometer controls the output voltage of the variable output regulator, to thereby control energy (voltage or current) to be supplied to the LED from the variable output regulator, and in which the CPU transmits a control signal to the digital potentiometer to control the output voltage of the variable output regulator, thereby adjusting the light emission amount of the LED by controlling the energy (voltage or current) to be supplied to the LED from the variable output regulator.

In order to solve the above-mentioned problems, according to a sixth aspect of the invention, there is provided a photoelectric sensing sensitivity adjusting device of an optical-sensing non-contact switching device (SW) for a field device, in which the photo IC of the photoelectric sensing sensitivity adjusting device of an optical-sensing non-contact switching device (SW) for a field device according to the fifth aspect of the invention includes: a photodetection portion; a pulse generator; an AND circuit; and a transistor, in which the photodetection portion detects the light which is emitted from the LED and reflected by the light reflector, and outputs a received optical signal to one terminal of the AND circuit when the light has a given light amount or more, in which the pulse generator outputs a given pulse signal to cause the LED to emit the light in synchronization with the given pulse signal by using the given pulse signal, and inputs the given pulse signal to another terminal of the AND circuit, in which the AND circuit performs an AND operation between the received optical signal, which is output after the light emitted from the LED is received, and the given pulse signal output from the pulse generator, and outputs a resultant to the CPU, and in which the transistor is turned on/off by the given pulse signal output from the pulse generator so as to cause the LED to emit the light in synchronization with the given pulse signal.

In order to solve the above-mentioned problems, according to a seventh aspect of the invention, there is provided a photoelectric sensing sensitivity adjusting device of an optical-sensing non-contact switching device (SW) for a field device, in which the digital potentiometer of the photoelectric sensing sensitivity adjusting device of an optical-sensing non-contact switching device (SW) for a field device according to the fifth or sixth aspects of the invention includes a wiper terminal provided with an adjustment level corresponding to 32 bits, and in which, by using a CS signal specifying a target device, an UP/DOWN signal for determining whether the adjustment level of the digital potentiometer is to be increased or decreased, and a signal (counter signal) for shifting the adjustment level of the digital potentiometer every time a pulse edge is detected, which are output via digital control lines from a PIO built in the CPU, the digital potentiometer controls, according to the adjustment level, a connecting location of a wiper terminal of the variable output regulator to change a resistance value of the second resistor connected to the another end of the variable output regulator, and controls a resistance-divided voltage ratio between the second resistor and the first resistor which is connected to the one end of the variable output regulator, thereby controlling the output voltage (or current) to be supplied to the LED from the variable output regulator.

In order to solve the above-mentioned problems, according to an eighth aspect of the invention, there is provided a photoelectric sensing sensitivity adjusting device of an optical-sensing non-contact switching device (SW) for a field device, in which the CPU of the photoelectric sensing sensitivity adjusting device of an optical-sensing non-contact switching device (SW) for a field device according to the seventh aspect of the invention is configured to, according to a given program:

determine, based on an input of an output signal output from the AND circuit of the photo IC, whether or not the light has been emitted from the LED;

until the photodetection portion of the photo IC detects reflection light obtained when the light emitted from the LED is reflected by the light reflector, sequentially control, according to the adjustment level corresponding to 32 bits, a connecting location of the wiper terminal of the digital potentiometer by using the CS signal specifying the target device, the UP/DOWN signal for determining whether the adjustment level of the digital potentiometer is to be increased or decreased, and the signal (counter signal) for shifting the adjustment level of the digital potentiometer every time the pulse edge is detected, which are output via the digital control lines from the PIO built in the CPU; and control the resistance-divided voltage ratio between the first resistor connected to the one end of the variable output regulator and the second resistor connected to the another end of the variable output regulator, thereby controlling the output voltage (or current) to be supplied to the LED from the variable output regulator.

In order to solve the above-mentioned problems, according to a ninth aspect of the invention, there is provided a photoelectric sensing sensitivity adjusting device of an optical-sensing non-contact switching device (SW) for a field device, in which the photoelectric sensing sensitivity adjusting device of an optical-sensing non-contact switching device (SW) for a field device according to any of the fifth through eighth aspects of the invention has an automatic sensitivity adjustment function for optical sensing including:

a first step of resetting a current adjustment level of the commercially available digital potentiometer to set an adjustment level of the digital potentiometer to a maximum sensitivity level;

a second step of determining whether or not the light of the LED which is emitting the light under a state of the first step is detected by the photodetection portion provided inside the photodetector;

a third step of outputting, when the light of the LED is detected in the second step, a signal for changing (down-shifting) the wiper terminal of the digital potentiometer to the digital potentiometer from the CPU via the digital control line connecting the digital potentiometer and the CPU, and setting the adjustment level of the digital potentiometer to be decreased by "1" (by 1 bit);

a fourth step of determining whether or not sensitivity of the wiper terminal of the digital potentiometer can be adjusted (down-shifted) to fall within an adjustment level range; and a fifth step of determining, when the sensitivity adjustment can be performed on the adjustment level in the fourth step, whether or not the adjustment level falls within the adjustment level range (=27 to 5) of the wiper terminal of the digital potentiometer, and in which the adjusted sensitivity of the photoelectric sensor is decreased or increased in a stepwise manner, and the adjustment is ended at a level at which an output from the photodetector is changed.

In order to solve the above-mentioned problems, according to a tenth aspect of the invention, there is provided a photoelectric sensing sensitivity adjusting device of an optical-sensing non-contact switching device (SW) for a field device, in which the photoelectric sensing sensitivity adjusting device of an optical-sensing non-contact switching device (SW) for a field device according to any one of the fifth through ninth aspects of the invention has an automatic correction function for an optical switch, including:

a first step of determining whether or not a long period of time (for example, 60 minutes or longer) has successively elapsed after a state of output from the photodetector became ON;

a second step of determining that there is a malfunction when an ON state has been kept successively for the long period of time (for example, 60 minutes or longer) after the state of the output from the detector became ON in the first step, outputting a signal for changing (down-shifting) the wiper terminal to the digital potentiometer from the CPU, and setting the sensitivity adjustment level of the photodetector to be decreased by "1" level;

a third step of determining whether or not the state of the output from the photodetector is ON even after the sensitivity adjustment level of the photodetector is set to be decreased by the "1" level in the second step;

a fourth step of controlling the sensitivity adjustment level of the photodetector until the state of the output from the photodetector becomes OFF after determining in the third step that the sensitivity adjustment level of the photodetector is continuously high because the state of the output from the photodetector is ON; and a fifth step of determining, when the state of the output from the photodetector becomes OFF in the fourth step, that the sensitivity adjustment level of the photodetector has become appropriate, and ending controlling the sensitivity adjustment level of the photodetector, and in which the adjusted sensitivity of the optical switch is decreased in a stepwise manner, and the adjustment is ended at the level at which the output from the photodetector is changed, thereby automatically correcting the sensitivity adjustment of the optical switch.

According to the present invention, it is possible to provide such stable sensitivity adjustment without individual differences that enables the amount of light of the light emitter (for example, LED) to be adjusted automatically without exposing the inside of the instrument to external air and depending on the sense of the operator.

Further, according to the present invention, digital adjustment is performed by using the CPU, and hence the adjusted value can be held as digital data, and automatic adjustment can be performed by using a communication function.

Further, according to the present invention, it is determined that there is an abnormality when the light receiving element has continuously received light for a given period of time or longer, and it is possible to perform automatic correction in which the digital potentiometer is controlled so that the detection sensitivity is decreased to such a level that the light receiving element does not respond to the light at that time on the CPU side, and the current to be supplied to the light emitter is changed (decreased).

DETAILED DESCRIPTION OF THE INVENTION

A switching operation portion of a field device is configured so as not to be exposed to external air with the provision of a light-emitter-beam transmissive material (for example, glass) to a front surface thereof. The operation portion is realized by: a light emitter configured by an LED; a regulator for LED driving which has a variable output function and supplies energy (current or voltage) to the LED; a light receiving device for receiving light emitted from the light emitter; a commercially available digital potentiometer for controlling increase or decrease of the energy (current or voltage) to be supplied to the LED; a CPU for digitally controlling increase or decrease of the energy (current or voltage) to be supplied to the LED in accordance with a control program; and a photo-detection portion for detecting an optical signal emitted from the LED, converting the optical signal to an electrical signal, and outputting the electrical signal.

Note that, a commercially available photo IC may be used as the photodetection portion, and there may be provided a photodetector which includes, as internal structure, a pulse generator for outputting a given pulse signal, and an AND circuit for outputting an AND signal obtained between the electrical signal output from the photodetection portion and the given pulse signal output from the pulse generator.

First Embodiment

Hereinbelow, a first embodiment for carrying out the present invention is described with reference to FIGS. 1 to 9.

Figure 1:
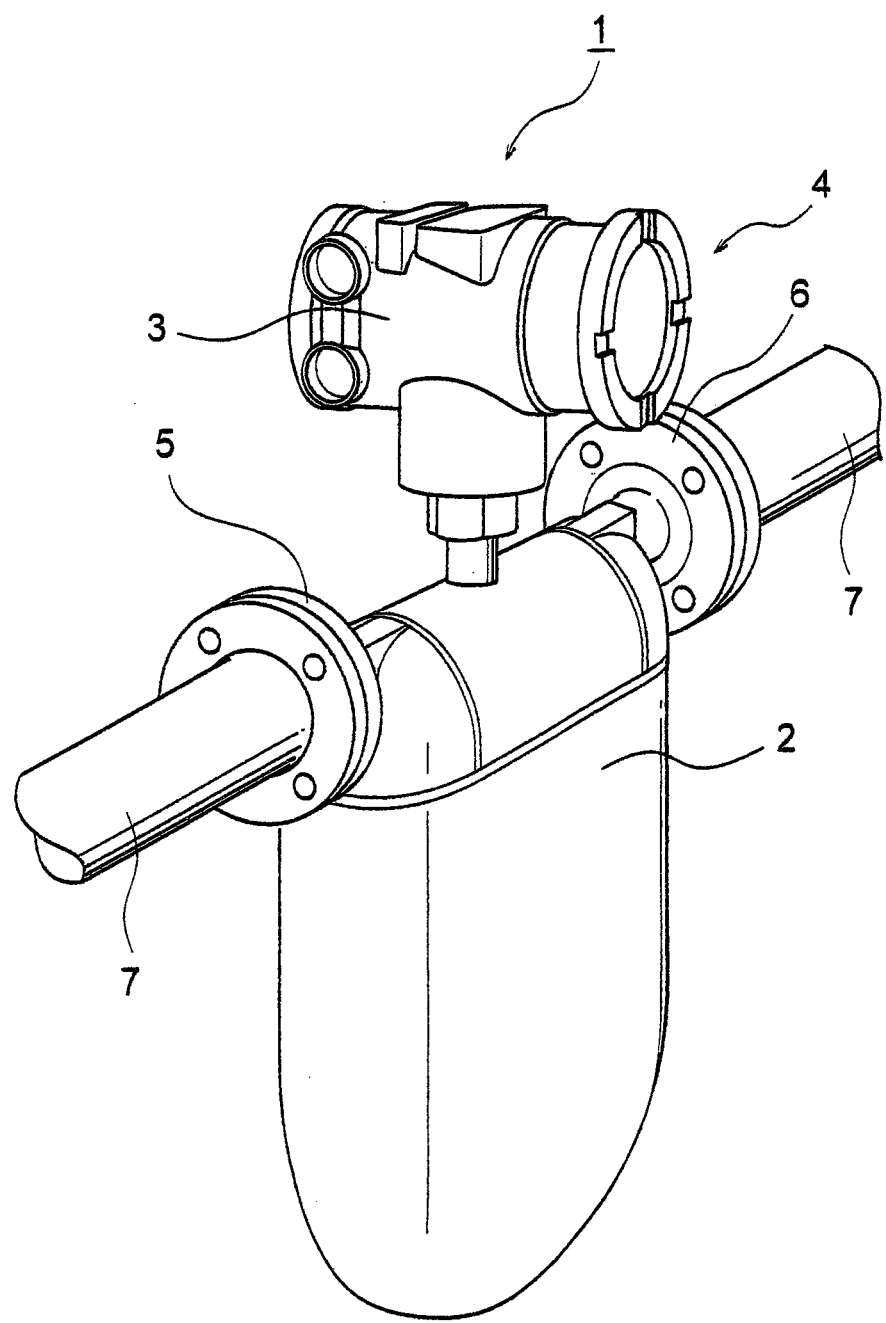
FIG. 1 is a diagram illustrating an external appearance of a Coriolis flowmeter, which is a field device to which a photoelectric sensing sensitivity adjusting device of an optical-sensing non-contact switching device (SW) for a field device according to the present invention is applied.
Figure 2:
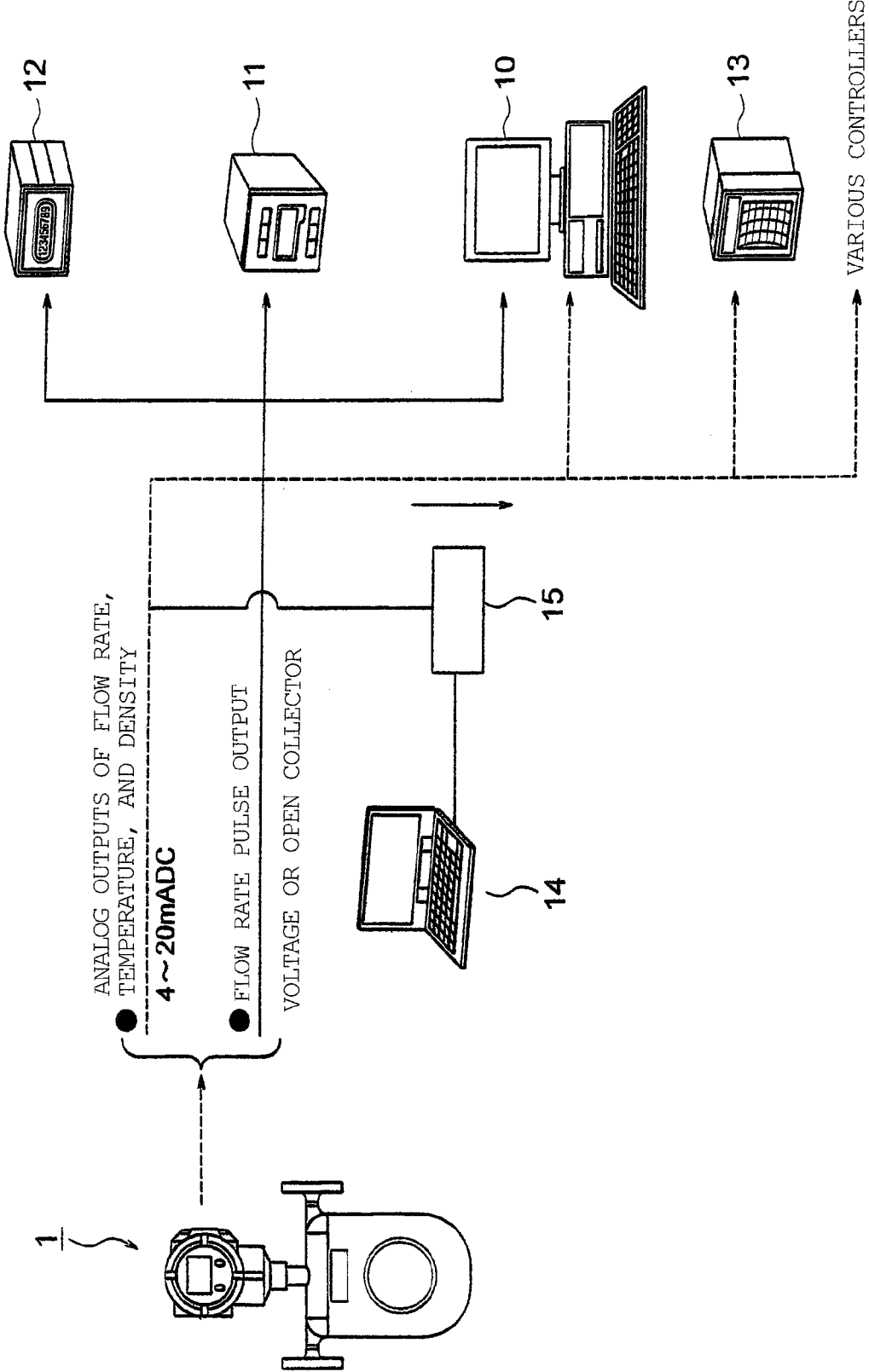
FIG. 2 is an overview diagram of a remote measurement system of the Coriolis flowmeter illustrated in FIG. 1.
Figure 3:
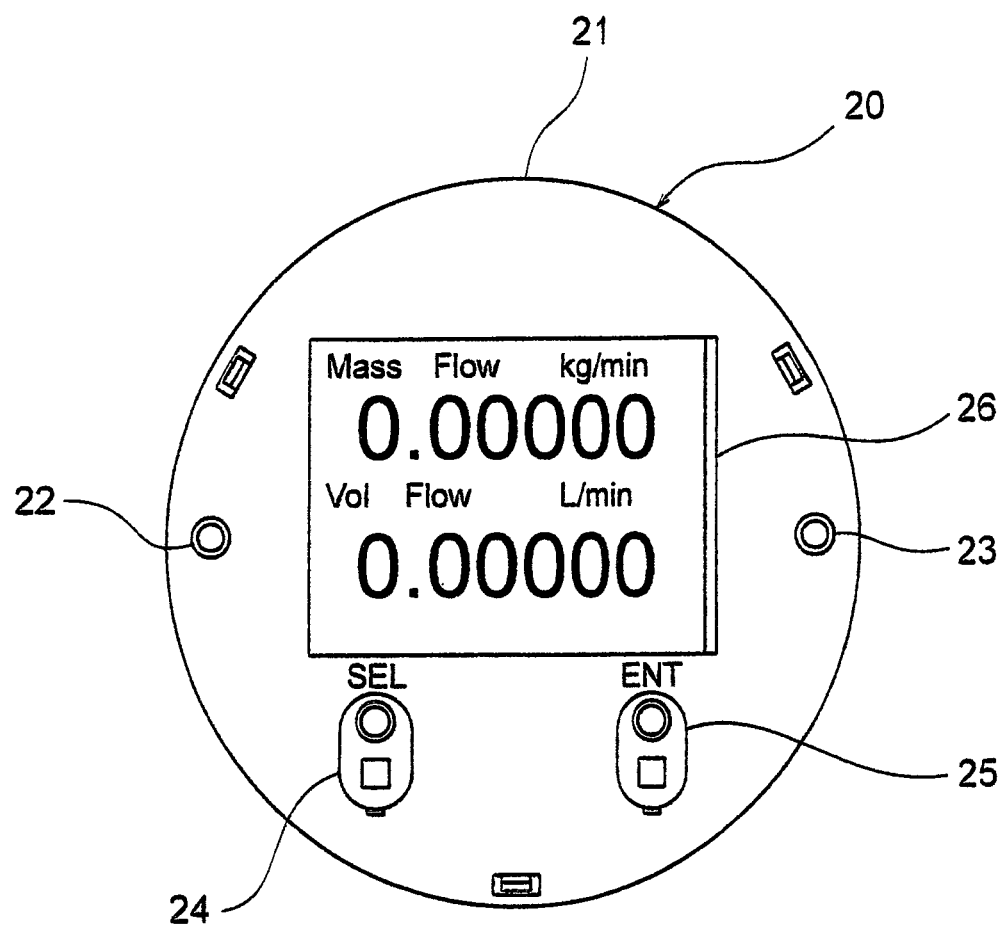
FIG. 3 is a diagram illustrating a photoelectric-sensing display portion of the optical-sensing non-contact switching device (SW) for a field device according to the present invention.
Figure 4:
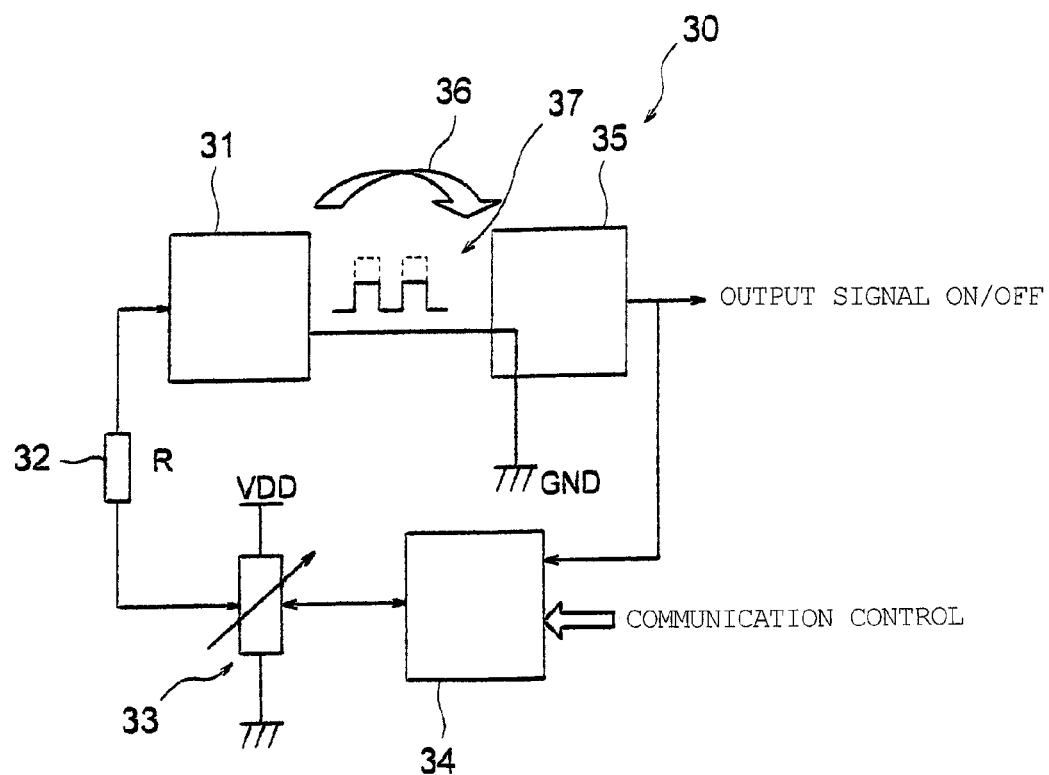
FIG. 4 is a block diagram of a sensitivity adjustment function portion, for describing a photoelectric sensing sensitivity adjustment function of the optical-sensing non-contact switching device (SW) for a field device according to the present invention.
Figure 5:
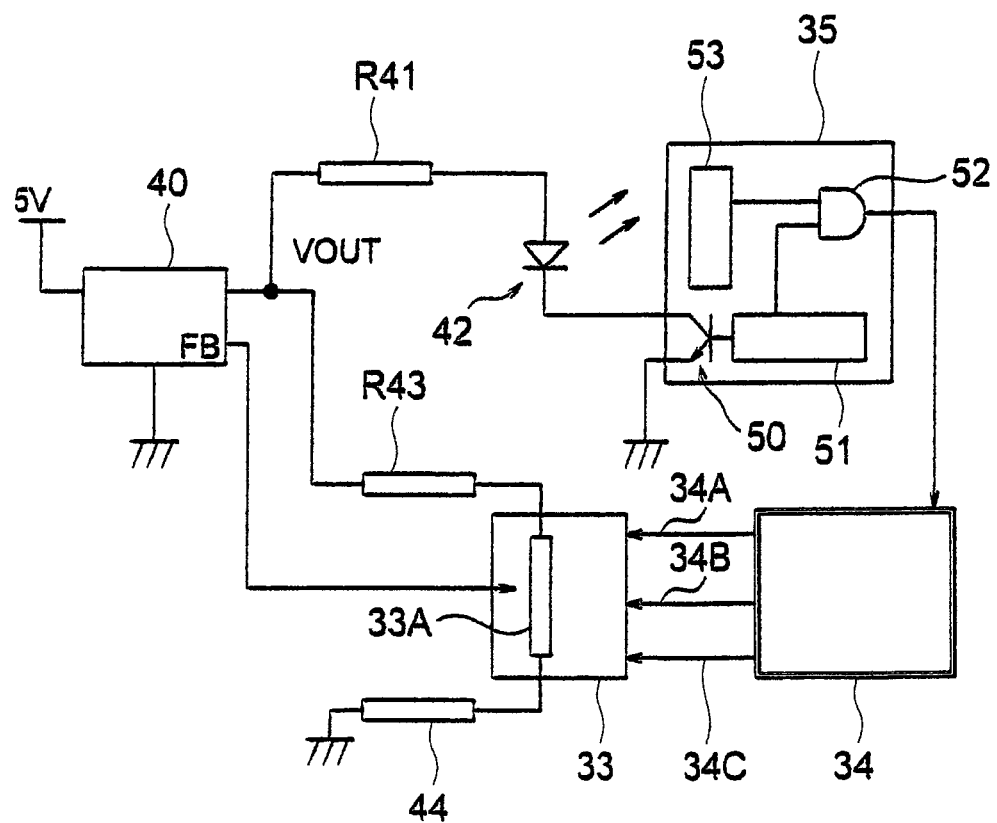
FIG. 5 is a detailed circuit diagram of the sensitivity adjustment function portion for photoelectric sensing of the optical-sensing non-contact switching device (SW) for a field device, which is illustrated in FIG. 4.
Figure 6:
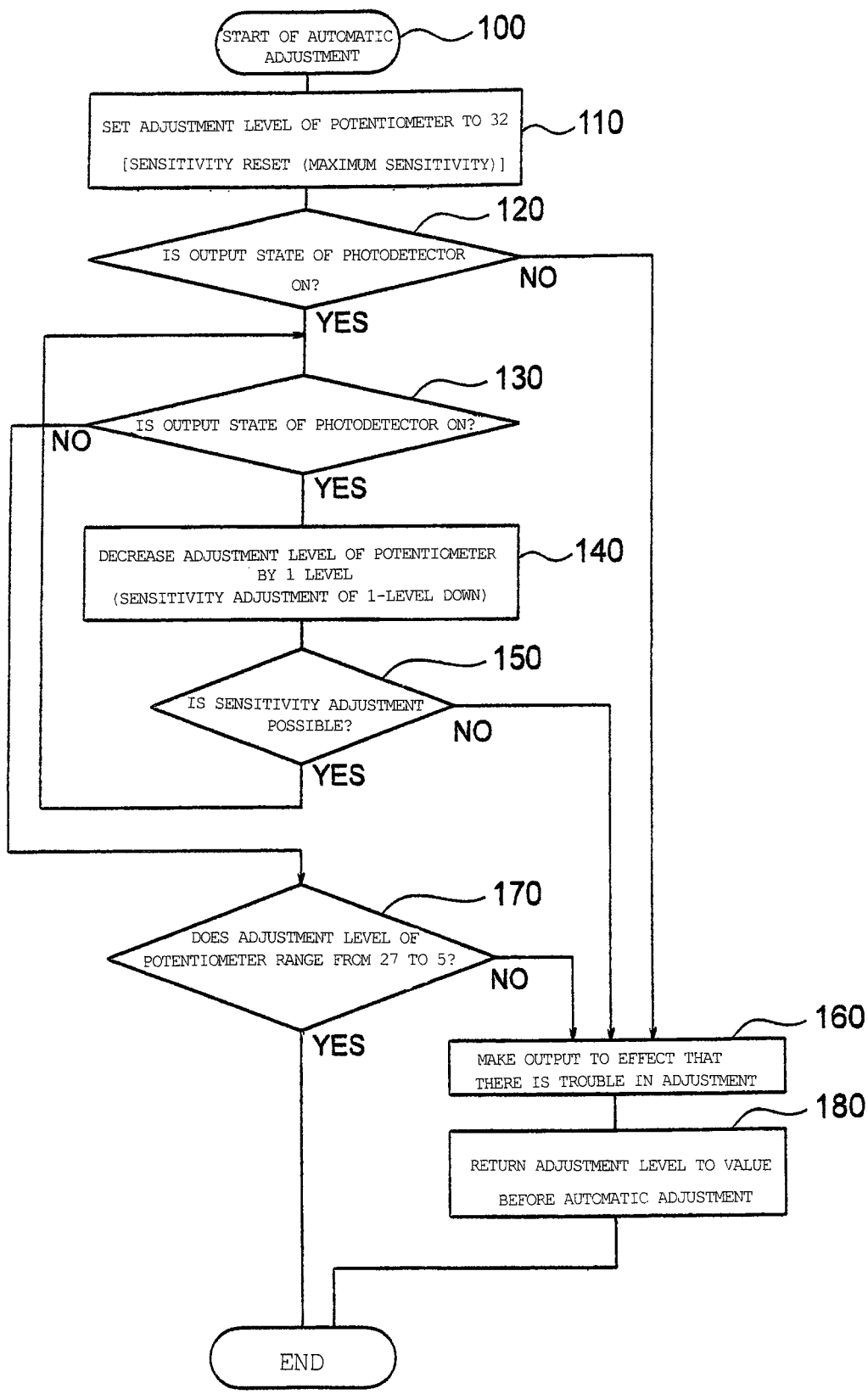
FIG. 6 is a control flowchart in which automatic sensitivity adjustment of the photoelectric sensing sensitivity adjusting device of the optical-sensing non-contact switching device (SW) for a field device, which is illustrated in FIG. 5, is performed.
Figure 7:
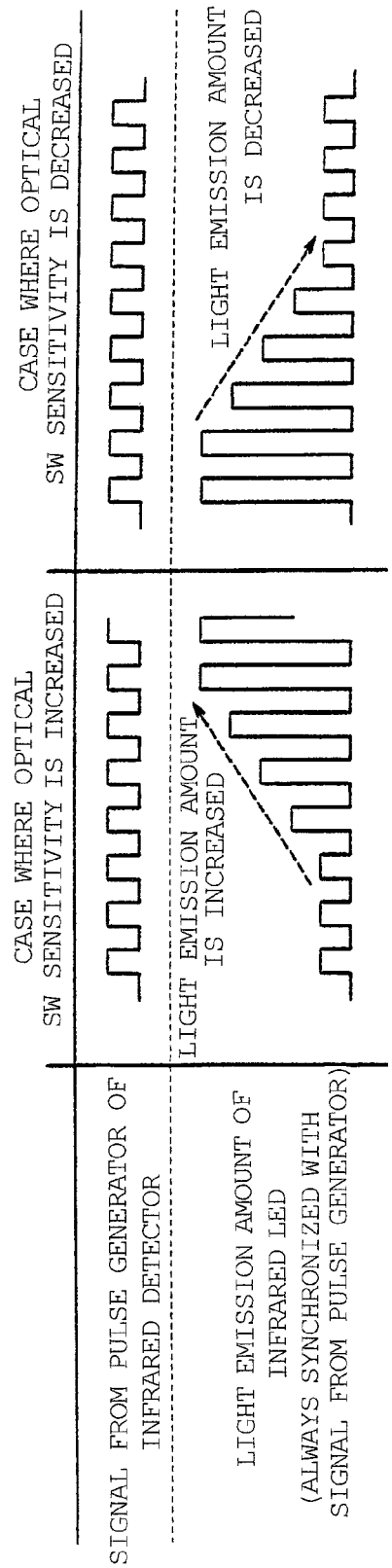
FIG. 7 is a time chart illustrating synchronization between light emission of an LED and a photodetector.
Figure 8:
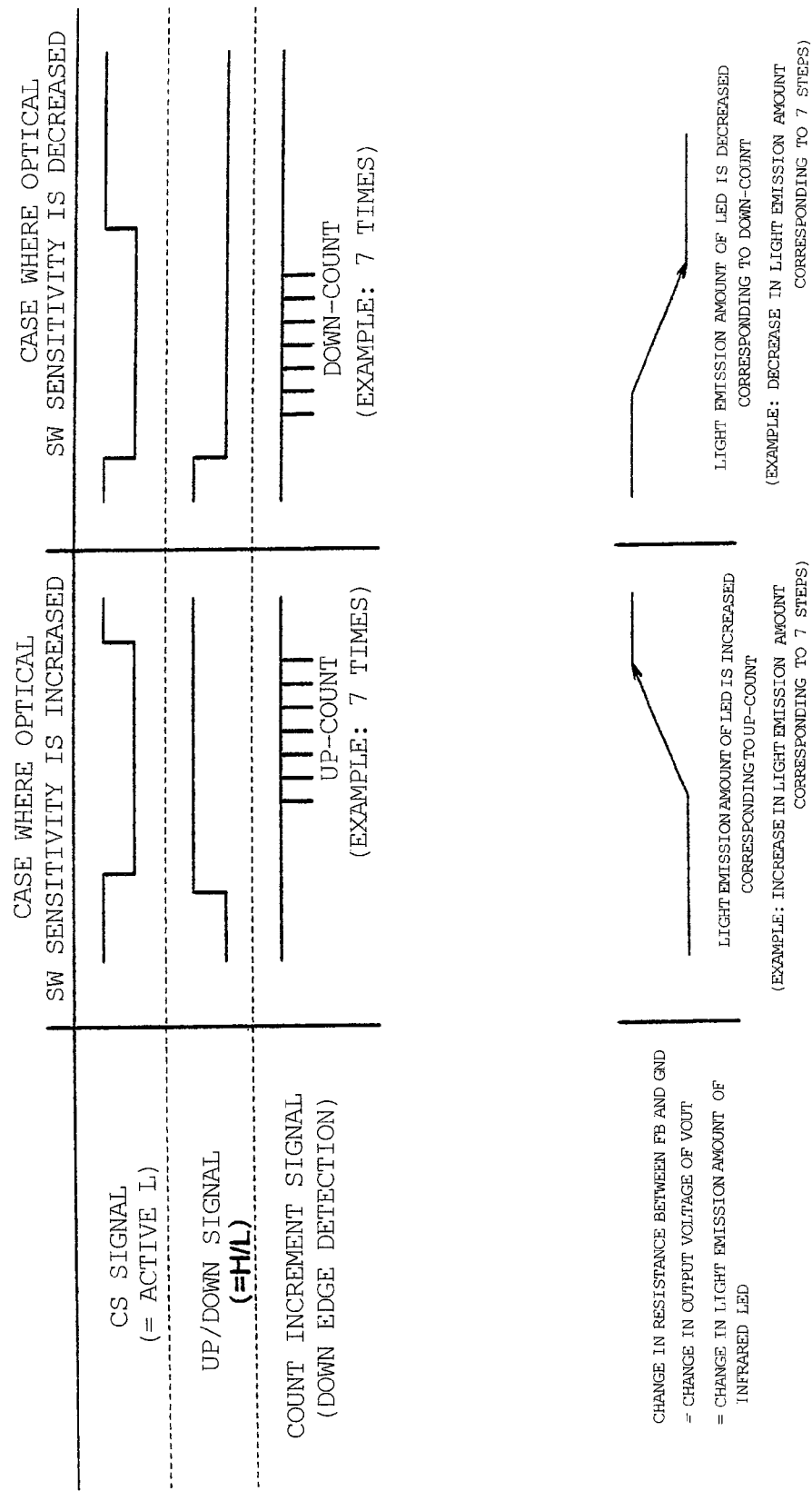
FIG. 8 is a time chart illustrating control signals for a digital potentiometer, which are transmitted from a CPU.
Figure 9:
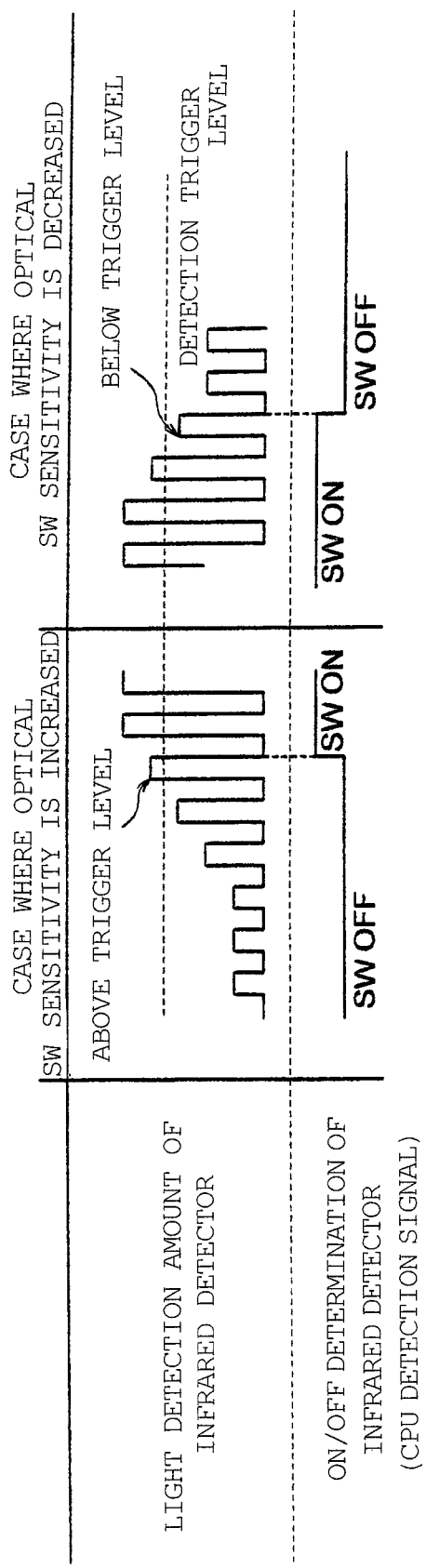
FIG. 9 is a time chart illustrating ON/OFF determinations by means of the photodetector.

FIG. 1 is a diagram illustrating an external appearance of a Coriolis flowmeter to which a photoelectric sensing sensitivity adjusting device of an optical-sensing non-contact switching device (SW) for a field device according to the present invention is applied. FIG. 2 is an overview diagram of a remote measurement system of the Coriolis flowmeter serving as the field device, which is illustrated in FIG. 1. FIG. 3 is a diagram illustrating a display portion of the photoelectric sensing sensitivity adjusting device of the optical-sensing non-contact switching device (SW) for a field device according to the present invention. FIG. 4 is a block diagram of a sensitivity adjustment function portion, for describing a sensitivity adjustment function of the photoelectric sensing sensitivity adjusting device of the optical-sensing non-contact switching device (SW) for a field device according to the present invention. FIG. 5 is a detailed circuit diagram of the sensitivity adjustment function portion of the photoelectric sensing sensitivity adjusting device of the optical-sensing non-contact switching device (SW) for a field device, which is illustrated in FIG. 4. FIG. 6 is a control flow chart in which automatic sensitivity adjustment of the photoelectric sensing sensitivity adjusting device of the optical-sensing non-contact switching device (SW) for a field device, which is illustrated in FIG. 4, is performed. FIG. 7 is a time chart illustrating control signals of a digital potentiometer, which are transmitted from a CPU. FIG. 8 is a time chart illustrating synchronization between light emission of an LED and a detector. FIG. 9 is a time chart illustrating ON/OFF determinations by means of the detector.

FIG. 1 illustrates the external appearance of the Coriolis flowmeter, which is a field device to which the photoelectric sensing sensitivity adjusting device of the optical-sensing non-contact switching device (SW) for a field device according to the present invention is applied.

Referring to FIG. 1, a Coriolis flowmeter 1, which is equipped with a high functionality transmitter (capable of a self-diagnosis function, large-screen display, and setting change on the spot through a touch operation), is a high performance Coriolis flowmeter capable of directly measuring a mass flow rate with high precision. The Coriolis flowmeter 1 includes a main body portion 2 including a converter 3, and an indicator 4 provided to the converter 3 which is mounted, at the midpoint of the main body portion, from a direction orthogonal to an axial direction of the main body portion 2. The indicator 4 employs a liquid crystal display.

The Coriolis flowmeter 1 is mounted to flange portions 5 and 6 formed at both sides of the axial direction of the main body portion 2 along a pipe 7 through which a fluid to be measured (not shown) flows, and is capable of measuring the fluid to be measured, which is flowing inside the pipe 7, and performing, at the converter 3, a calculation regarding the flow rate. The Coriolis flowmeter 1 is capable of displaying the flow rate obtained through the calculation on the indicator 4 of the converter 3.

FIG. 2 illustrates an overview of the remote measurement system of the Coriolis flowmeter 1 illustrated in FIG. 1. Specifically, the Coriolis flowmeter 1 has explosion-proof structure, which is such structure that has no fear of explosion even if an inflammable gas has leaked into an ambient atmosphere of the Coriolis flowmeter 1 when measuring the flow rate of an inflammable fluid to be measured (inflammable gas, inflammable volatile liquid, etc.).

In the Coriolis flowmeter 1 having such structure, as illustrated in FIG. 2, remote operation control is performed by using external output. Specifically, the Coriolis flowmeter 1 is connected, by means of the external output, to a distributed control system (DCS) computer 10, a batch counter 11, an integrator 12, a recorder 13, various controllers, and the like. Further, the Coriolis flowmeter 1 is intercommunicably connected via a communication terminal unit 15 to a personal computer 14, which serves as a host of the field device, so that the setting, changing, and adjustment of parameters, reading of a measured value, or the like can be performed on the spot or from a remote location.

The operation of the Coriolis flowmeter 1 connected via the external output in this way is controlled remotely. The measured values of the flow rate, the temperature, and the density measured by the Coriolis flowmeter 1 are output via analog output to the distributed control system (DCS) computer 10, the recorder 13, the various controllers, and the like. Further, digital communication can be performed with respect to the personal computer 14 connected via the communication terminal unit 15.

Further, a flow rate pulse output signal, which is an output regarding the flow rate measured by the Coriolis flowmeter 1, is output to the distributed control system (DCS) computer 10, the batch counter 11, the integrator 12, and the like.

FIG. 3 illustrates the display portion of the indicator 4 provided to the converter 3 of the Coriolis flowmeter 1 illustrated in FIG. 1.

Referring to FIG. 3, a front surface 21 of the display portion 20 of the indicator 4 is attached with a light-emitter-beam transmissive material (for example, glass).

In the figure, reference numeral 22 denotes a red LED, and reference numeral 23 denotes a green LED. Further, reference numerals 24 and 25 denote switching operation portions of optical switches, which can be turned on or off through the touch operation. Mode switching by the switching operation portion 24 or 25 of optical switches is performed by an operation (touch operation) of touching, with a finger tip, the front surface 21 of the display portion 20, which is formed of a light-emitter-beam transmissive material (for example, glass).

Figure 11:
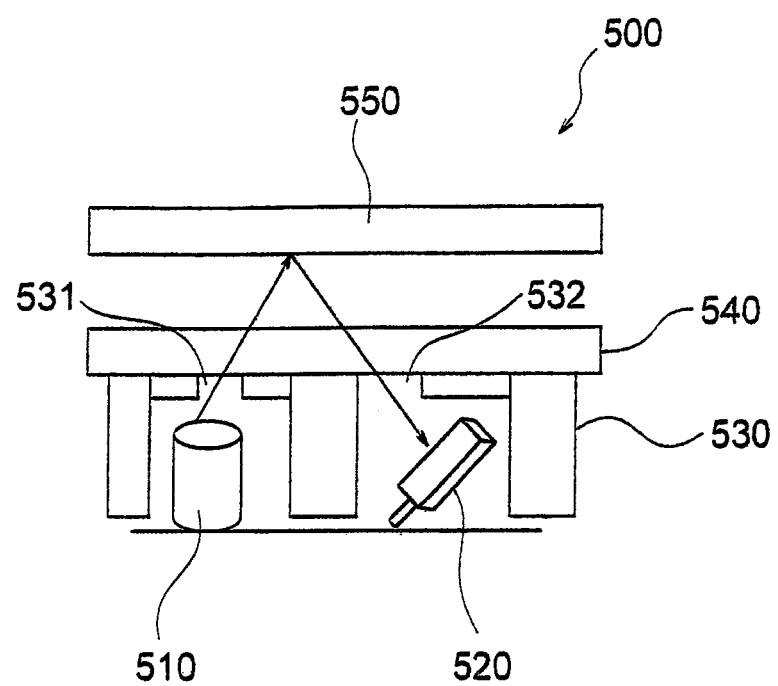
FIG. 11 is an explanatory diagram illustrating a principle of a conventional optical switch.
Figure 12:
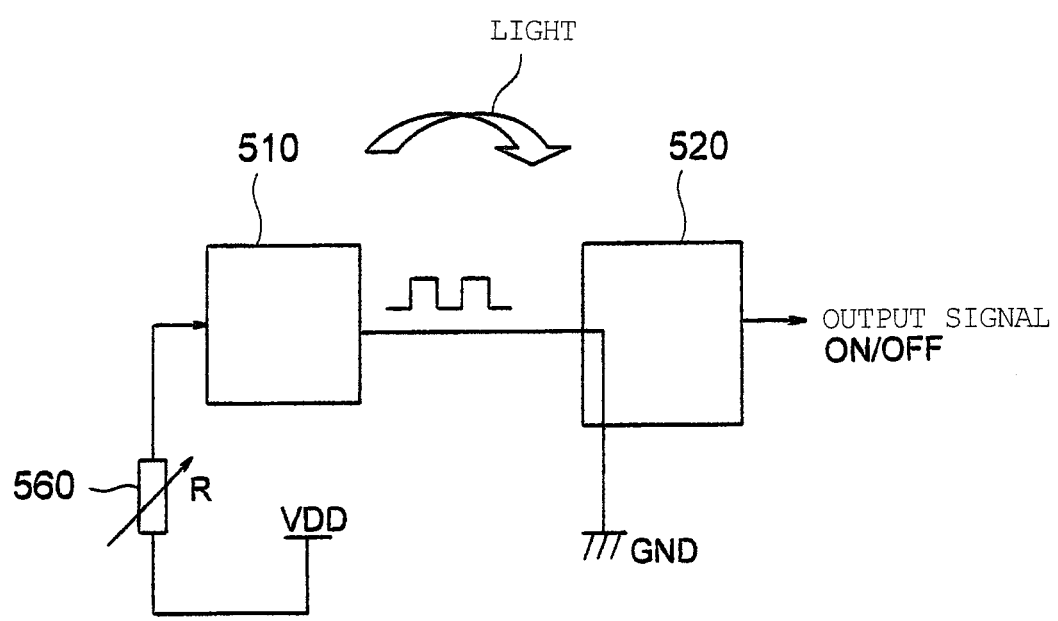
FIG. 12 is a diagram for describing a sensitivity adjustment function illustrated in FIG. 11.

The optical switch has the same structure as an optical switch 500 illustrated in FIG. 11. Specifically, the optical switch 500 includes a photosensor configured by a light emitter (for example, LED) 510 and a photodetector (for example, photo IC) 520, and the light emitter (for example, LED) 510 and the photodetector (for example, photo IC) 520 are each surrounded by a light blocking structure 530.

Above the light emitter (for example, LED) 510 surrounded by the light blocking structure 530, there is formed an opening 531 so that light emitted from the light emitter (for example, LED) 510 is emitted upward from inside the light blocking structure 530. Further, above the photodetector (for example, photo IC) 520 surrounded by the light blocking structure 530, there is formed an opening 532 so that the light emitted from the light emitter (for example, LED) 510 enters the inside of the light blocking structure 530 from a predetermined direction after being reflected by a light reflector.

A top side of the light blocking structure 530 is covered with a light-emitter-beam transmissive material (for example, glass) 540. Specifically, the light-emitter-beam transmissive material (for example, glass) 540 serves as a top cover of the light blocking structure 530, and corresponds to a glass cover portion of a housing of a display device (corresponding to a setting device portion of the field device) of a measuring instrument (converter).

In the optical switch 500 having the above-mentioned configuration, light is constantly emitted from the light emitter (for example, LED) 510, and the light emitted from the light emitter (for example, LED) 510 is emitted from the opening 531 formed above the light blocking structure 530. Further, the photodetector (for example, photo IC) 520 is capable of constantly receiving the incident light from the opening 532 formed above the light blocking structure 530.

In such a state, when a light reflector (detection object) 550, such as a finger, is put over a top surface (switching operation portion 24 or 25 of FIG. 3) of the light-emitter-beam transmissive material (for example, glass) 540, the light emitted from the light emitter (for example, LED) 510 and then from the opening 531 formed above the light blocking structure 530 is reflected by the light reflector (detection object) 550, such as a finger, which has been put over the light-emitter-beam transmissive material (for example, glass) 540, and is then caused to enter the opening 532 formed above the light blocking structure 530, with the result that the light is received by the photodetector (for example, photo IC) 520 to thereby perform the switching.

Further, in FIG. 3, reference numeral 26 denotes a data display screen of the display portion 20 of the indicator 4 provided to the converter 3 of the Coriolis flowmeter 1.

The data display screen 26 is for selectively displaying, on the screen, the measured values of the flow rate, the temperature, and the density, and the like. A switching operation (ON operation) is performed through the operation (touch operation) of touching, with a finger tip, the top surfaces of the switching operation portions 24 and 25 of the front surface 21 of the display portion 20 formed of a light-emitter-beam transmissive material (for example, glass), thereby performing mode switching.

Examples of display modes, which are to be selectively displayed on the data display screen 26, include an instantaneous mass flow rate, an instantaneous volume flow rate, a density, a temperature, an integrated value (mass or volume), maintenance information display, status information display, and mode selection (parameter setting). The switching of those display modes to be displayed on the data display screen 26 is performed by means of the optical switch provided to the indicator 4 of the converter 3 of the Coriolis flowmeter 1. In the optical switch, light emitted from the light emitter (for example, LED) 510 is reflected by a finger put over the light-emitter-beam transmissive material (for example, glass) 540 (switching operation portion 24 or 25 of FIG. 3), and the reflected light is received by the photodetector (for example, photo IC) 520.

In this way, the switching is performed when the light emitted from the light emitter (for example, LED) 510 is reflected by a finger put over the switching operation portion 24 or 25, and is then received by the photodetector (for example, photo IC) 520. Accordingly, in some cases, there occurs a malfunction in which the switching is not performed despite a finger being put over the switching operation portion 24 or 25, or the switching is performed despite a finger not being put over the switching operation portion 24 or 25. Thus, it is required that the sensitivity as the photosensor be appropriately maintained.

For this reason, the indicator 4 of the converter 3 of the Coriolis flowmeter 1 illustrated in FIG. 1 is provided with the photoelectric sensing sensitivity adjusting device for adjusting the detection sensitivity of the optical switch.

FIG. 4 is a block diagram of a sensitivity adjustment function portion of a photoelectric sensing sensitivity adjusting device 30 provided to the indicator 4 of the converter 3 of the Coriolis flowmeter 1 illustrated in FIG. 1.

Referring to FIG. 4, a resistor R32 is connected to a light emitter (for example, LED) 31 of the photoelectric sensing sensitivity adjusting device 30, and a commercially available digital potentiometer 33 is connected to the resistor R32. The digital potentiometer 33, which performs adjustment and trimming for an electronic circuit, has a function of increasing/decreasing output voltage (or output current) to be output to the light emitter (for example, LED) 31 by means of an output signal from a CPU 34. The CPU 34 can also be controlled, via the communication terminal unit 15 illustrated in FIG. 2, through digital communication from the personal computer 14 serving as a host of the field device.

Based on the above-mentioned output voltage (or the output current) controlled by the digital potentiometer 33, light 36 is emitted from the light emitter (for example, LED) 31 of the photoelectric sensing sensitivity adjusting device 30. The light 36 emitted from the light emitter (for example, LED) 31 is a given optical pulse signal 37 whose light amount is changed according to increase or decrease in output voltage (or output current) by the digital potentiometer 33. The given optical pulse signal 37 emitted from the light emitter (for example, LED) 31 is detected by a photodetector (for example, photo IC) 35, and an ON/OFF output signal is output from the photodetector (for example, photo IC) 35.

FIG. 5 is a detailed circuit diagram of the sensitivity adjustment function portion of the non-contact switching device (SW) including the photoelectric sensing sensitivity adjusting device of the flowmeter, which is illustrated in FIG. 4.

Referring to FIG. 5, an anode of an LED 42 is connected to a regulator 40 for LED driving (variable output regulator provided with an output adjusting function) via a resistor R41. Further, the digital potentiometer 33 is connected to the regulator 40 for LED driving (variable output regulator provided with an output adjusting function) via a resistor R43. A wiper terminal 33A of the digital potentiometer 33 is grounded via a resistor R44 through the internal resistance of the digital potentiometer 33.

Further, a wiper terminal of the regulator 40 for LED driving (variable output regulator provided with an output adjusting function) is connected to the wiper terminal 33A (provided with a 32-bit adjustment level) of the digital potentiometer 33. The wiper terminal 33A of the digital potentiometer 33 controls the connecting location of the wiper terminal of the regulator 40 for LED driving (variable output regulator provided with an output adjusting function) to control a resistance-divided voltage ratio, thereby controlling energy (voltage or current) to be supplied to the light emitter (for example, LED) 42 from the regulator 40 for LED driving (variable output regulator provided with an output adjusting function).

Note that, in this embodiment, as the light emitter (for example, LED) 31, an LED manufactured by Sanken Electric Co., Ltd. (specifically, "SID1003BQ") is used.

Further, as the digital potentiometer 33, a 32-tap digital potentiometer manufactured by NIDEC COPAL ELECTRONICS CORP. (specifically, "DP7114ZI-10") is used.

Further, as the CPU 34, a CPU manufactured by Renesas Technology Corporation (specifically, "R5F21237JFP") is used.

Further, as the photodetector (for example, photo IC) 35, a photo IC manufactured by Toshiba Corporation (specifically, digital output photo IC "TPS816(F)") is used.

Further, as the regulator 40 for LED driving (variable output regulator provided with an output adjusting function), a regulator manufactured by Texas Instruments Incorporated (specifically, variable positive/negative voltage regulator "TPS73101DBVT") is used.

Further, the CPU 34 is connected to the commercially available digital potentiometer 33 of this embodiment with three digital control lines 34A, 34B, and 34C.

The digital control line 34A connecting the digital potentiometer 33 and the CPU 34 is used to output, from the CPU 34 to the digital potentiometer 33, a signal (counter signal) for incrementing (or decrementing) a counter value of the digital potentiometer 33 every time the wiper terminal 33A of the digital potentiometer 33 is changed (UP/DOWN).

Further, the digital control line 34B connecting the digital potentiometer 33 and the CPU 34 is used to output, from the CPU 34 to the digital potentiometer 33, a signal for changing (UP/DOWN) the wiper terminal 33A of the digital potentiometer 33.

Further, the digital control line 34C connecting the digital potentiometer 33 and the CPU 34 is used to output, from the CPU 34 to the digital potentiometer 33, a chip select (CS) signal, which is a selection signal for selecting a chip.

It is to be understood that the interface with respect to the CPU varies depending on the specifications of the digital potentiometer (for example, serial communication, I2C, UART, etc.).

Further, the photodetector (for example, photo IC) 35 of this embodiment is a commercially available product, and includes a transistor Tr 50, a pulse generator 51, an AND circuit 52, and a photodetection portion 53.

A collector of the transistor Tr 50 is connected to a cathode of the LED 42, and an emitter of the transistor Tr 50 is grounded. Further, a base of the transistor Tr 50 is connected to the pulse generator 51, and a given pulse signal is supplied to the base of the transistor Tr 50 from the pulse generator 51. Thus, the transistor Tr 50 is repeatedly turned on/off in synchronization with the given pulse signal output from the pulse generator 51, and causes the LED 42 to be turned on/off in synchronization with the given pulse signal output from the pulse generator 51, with the result that the optical pulse signal synchronized with the given pulse signal output from the pulse generator 51 is emitted from the LED 42.

The pulse generator 51 is connected to the AND circuit 52, and the given pulse signal output from the pulse generator 51 is input to the AND circuit 52.

Further, the photodetection portion 53 of the photodetector (for example, photo IC) 35 of this embodiment is connected to the AND circuit 52, and a signal is input to the AND circuit 52 based on an optical signal detected by the photodetection portion 53.

The optical pulse signal emitted from the LED 42 and synchronized with the given pulse signal output from the pulse generator 51 is detected by the photodetection portion 53 of the photodetector (for example, photo IC) 35, and the optical pulse signal emitted from the LED 42 is converted to an electrical pulse signal and then output to the AND circuit 52.

The AND circuit 52 performs an AND operation between a signal based on an detected optical signal output from the photodetection portion 53 of the photodetector (for example, photo IC) 35 and the given pulse signal output from the pulse generator 51, to thereby output an AND signal. The output from the AND circuit 52 is input to the CPU 34.

Accordingly, an output is made from the AND circuit 52 only when the optical signal output from the LED 42 is in synchronization with the given pulse signal output from the pulse generator 51.

As described above, in this embodiment, there is given a circuit configuration in which the output voltage of the variable output regulator 40 provided with the output adjusting function is changed by using the commercially available digital potentiometer 33, and along with the change in output voltage (Vout) of the variable output regulator 40, a forward current of the LED 42 is increased or decreased, thereby adjusting the amount of light to be emitted.

The digital potentiometer 33 is controlled by a PIO built in the CPU 34, and the setting thereof is controlled via the three control lines for: the CS signal specifying a target device via the digital control line 34C; the UP/DOWN signal for determining whether the adjustment level of the digital potentiometer 33 is to be increased or decreased via the digital control line 34B; and the signal (counter signal) for shifting, via the digital control line 34A, the adjustment level of the digital potentiometer 33 every time a pulse edge is detected.

Note that, those set values are stored in the digital potentiometer 33 after the setting.

In the configuration described above, the setting of the output voltage of the regulator 40 with the output adjusting function is determined based on the voltage dividing ratio between an external resistor R1 (R43=56 kΩ of FIG. 5) and a resistor R2 (R44=20 kΩ of FIG. 5) resulting from an FB terminal of the variable output regulator 40 with the output adjusting function connected thereto.

The relational expression therefor is expressed as follows based on a data sheet.

$$V\text{out}=(R1+R2)/R2 \times 1.2 \quad (1)$$

In this embodiment, the digital potentiometer 33 having a resistance of 10 kΩ is inserted between R1 and R2, and hence when minimum and maximum voltage-divided resistances in the adjustment range are considered, the respective resistances are as follows.

R1: 66 kΩ R2: 20 kΩ
R1: 56 kΩ R2: 30 kΩ

Those values are substituted into Expression (1) for Vout, and Vout can be set to any value in a range from 4.8 V to 3.5 V (the adjustment step corresponds to a resolution (=32 bits, a change of 0.04 V per step (=1 bit)) of the digital potentiometer).

Specifically, the voltage to be applied to the LED 42 is such variable voltage as described above, and the LED 42 is connected to the transistor Tr 50 provided inside the photodetector (for example, commercially available photo IC) 35, and causes the forward current to be synchronized with a cycle generated by the pulse generator 51 provided inside the same photodetector (for example, photo IC) 35.

Here, assuming that a load resistor R3 (R41 of FIG. 5) has a resistance of 39Ω, a simple calculation provides a value of from 123 mA to 90 mA for the forward current of the LED 42, but by taking into account the voltage drop (≈1.2 V) of the transistor Tr 50 and a duty of 50% in the synchronization cycle, an actual variable range is approximately from 46 mA to 30 mA (which corresponds to a change of 0.4 mA per bit in the digital potentiometer 33).

Note that, the light of the LED 42 is received by the photodetection portion 53 provided inside the photodetector (for example, photo IC) 35, and a comparison is made to determine whether or not the light is an optical pulse synchronized with a timing generated by the pulse generator 51 built therein as well. When a match is confirmed, an output is made.

As described above, in this embodiment, in the circuit which adjusts electrical energy (current/voltage) to be applied to the light emitter (for example, LED) 31 as means for adjusting the light amount of the light emitter (for example, LED) 31 of the photoelectric sensing sensitivity adjusting device 30, the digital potentiometer 33 is used for the adjustment portion, and the digital control lines 34A, 34B, and 34C are connected to the CPU 34, with the result that the amount of the electrical energy can be controlled from the CPU 34.

Further, the control instruction from the CPU 34 is executed from an external by using communication means without exposing the inside of the instrument to the external air (for example, as in the HART protocol, the control instruction is realized by superimposing data onto an output signal line).

Next, referring to a flow chart, description is given of the automatic sensitivity adjustment of the photoelectric sensing sensitivity adjusting device of the flowmeter, which is illustrated in FIG. 5.

FIG. 6 is the control flow chart in which the automatic sensitivity adjustment of the photoelectric sensing sensitivity adjusting device of the flowmeter, which is illustrated in FIG. 4, is performed.

The automatic sensitivity adjustment of the photoelectric sensing sensitivity adjusting device of the flowmeter is for confirming the normality of the ON/OFF function of the optical switch and performing appropriate sensitivity adjustment for the optical switch. Thus, in the automatic sensitivity adjustment of the photoelectric sensing sensitivity adjusting device of the flowmeter, the CPU 34 performs the following tasks:

a) determining whether or not the output state of the detector is as expected by always setting the sensitivity level to the maximum or minimum in consideration of a fact that the optical switch has hysteresis in sensitivity;

b) decreasing or increasing the adjusted sensitivity in a stepwise manner, and ending the adjustment at a level at which the output of the detector changes; and c) setting the margin for adjustment based on the resolution of the digital potentiometer, thereby optimizing the adjusting function (for example, assuming that the margin for adjustment is five steps from the upper and lower limits, when the adjustment is ended outside the adjustment level of from 5 to 27, the adjustment is considered to be "NG").

Referring to FIG. 6, after the flowmeter (converter) is powered on to start the automatic adjusting function, first, the flow is started in Step 100, in which the automatic sensitivity adjustment of the photoelectric sensing sensitivity adjusting device is started.

First, after the flow is started in Step 100, in Step 110, the current adjustment level of the commercially available digital potentiometer 33 is reset to thereby set the adjustment level of the digital potentiometer 33 to a maximum sensitivity level ("32" in the embodiment). Specifically, the light amount of the LED 42 is set to a maximum value by maximizing the energy (voltage or current) to be supplied to the LED 42 via the resistor R41 from the regulator 40 for LED driving (commercially available variable output regulator provided with an output adjusting function). When the energy (voltage or current) to be supplied to the LED 42 is set to the maximum, the LED 42 emits light with a maximum light amount.

Specifically, in this embodiment, the resistance-divided voltage ratio determined by the digital potentiometer 33 is set to 10 kΩ/0Ω, thereby maximizing the energy (voltage or current) to be supplied to the LED 42 from the regulator 40 for LED driving (variable output regulator provided with an output adjusting function). When the energy (voltage or current) to be supplied to the LED 42 from the regulator 40 for LED driving (variable output regulator provided with an output adjusting function) is maximized, if a light reflecting jig is provided in the next step, the state of the photodetector (for example, photo IC) 35 on this occasion is in a switch-on state (Vout≈4.8 V).

After setting the adjustment level of the digital potentiometer 33 to the maximum sensitivity level ("32" in the embodiment) in Step 110, it is determined in Step 120 whether or not the light of the LED 42 which is emitting the light with the maximum light amount is detected by the photodetection portion 53 provided inside the photodetector (for example, commercially available photo IC) 35. Specifically, in this embodiment, if the photodetection portion 53 provided inside the photodetector (for example, commercially available photo IC) 35 detects the light of the LED 42, the AND operation is performed between the detected optical signal and the given pulse signal output from the pulse generator 51, and the AND signal is output to the CPU 34. Based on the presence/absence of the detected optical signal input to the CPU 34, it can be determined whether or not the light of the LED 42 is detected by the photodetection portion 53 provided inside the photodetector (for example, commercially available photo IC) 35.

In the above-mentioned detection of the light of the LED 42 by the photodetection portion 53 provided inside the photodetector (for example, commercially available photo IC) 35, according to this embodiment, the light is detected when the optical pulse signal which is emitted from the LED 42 and detected by the photodetection portion 53 of the photodetector (for example, photo IC) 35 coincides (is synchronized) with the given pulse signal output from the pulse generator 51.

FIG. 7 is the time chart illustrating the synchronization between the light emission of the LED and the photodetector. FIG. 7 illustrates a case in which the adjustment level of the digital potentiometer 33 is set to be increased by "1" (specifically, by 1 bit) and a case in which the adjustment level of the digital potentiometer 33 is set to be decreased by "1" (specifically, by 1 bit).

In Step 120, the optical sensitivity of the optical switch is set to the maximum sensitivity, and hence the LED 42 is emitting the light with the maximum light amount. Thus, under this state, there should be light detection (the switch is ON) by the photodetector (for example, photo IC) 35.

Accordingly, if the light of the LED 42 is detected by the photodetector (for example, photo IC) 35, this means that the photodetector (for example, photo IC) 35 is normally operating (operation as the optical switch is good).

On the other hand, if there is no output from the photodetector (for example, photo IC) 35 (state in which the optical switch is OFF) even though the LED 42 is emitting the light with the maximum light amount, this means that the optical switch has an operation failure.

When it is determined in Step 120 that the photodetector (for example, photo IC) 35 is normally operating (the operation of the optical switch is good) because the photodetection portion 53 provided inside the photodetector (for example, commercially available photo IC) 35 has detected the light of the LED 42 which is emitting the light with the maximum light amount, it is determined again in Step 130 whether or not the light of the LED 42 is detected by the photodetection portion 53 provided inside the photodetector (for example, photo IC) 35. In other words, it is determined whether or not the state of the output from the photodetector (for example, photo IC) 35 is ON.

The determination made in Step 120 regarding whether or not the photodetector (for example, photo IC) 35 has detected the light of the LED 42 is such a determination that is made regarding whether or not the photodetector (for example, photo IC) 35 has detected the light of the LED 42 under the state in which the LED 42 is emitting the light with the maximum light amount by maximizing the energy (voltage or current) to be supplied to the LED 42 from the regulator 40 for LED driving (commercially available variable output regulator provided with an output adjusting function) immediately after the automatic adjustment is started.

The determination made in Step 130 regarding whether or not the photodetector (for example, photo IC) 35 has detected the light of the LED 42 is such a determination that is simply made regarding whether or not the photodetector (for example, photo IC) 35 has detected the light emitted from the LED 42.

When it is determined in Step 130 that the light of the LED 42 is detected by the photodetection portion 53 provided inside the photodetector (for example, commercially available photo IC) 35, in Step 140, a signal for changing (down-shifting) the wiper terminal 33A of the digital potentiometer 33 is output to the digital potentiometer 33 from the CPU 34 via the digital control line 34B connecting the commercially available digital potentiometer 33 and the CPU 34, and the adjustment level of the digital potentiometer 33 is set to be decreased by "1" (specifically, by 1 bit).

Specifically, the resistance-divided voltage ratio determined by the digital potentiometer 33 is changed to decrease, by one level, the energy (voltage or current) to be supplied to the LED 42 from the regulator 40 for LED driving (variable output regulator provided with an output adjusting function). In other words, the setting of the wiper terminal 33A of the digital potentiometer 33 is shifted by 1 bit (shift of Vout≈0.04 V).

In Step 130, when the light of the LED 42 is detected by the photodetection portion 53 provided inside the photodetector (for example, photo IC) 35, the signal for changing (down-shifting) the wiper terminal 33A of the commercially available digital potentiometer 33 is output to the digital potentiometer 33, and the adjustment level of the digital potentiometer 33 is set to be decreased by "1" (specifically, by 1 bit).

However, the following may be performed. That is, after the flow is started in Step 100, in Step 110, the current adjustment level of the digital potentiometer 33 is reset to thereby set the adjustment level of the digital potentiometer 33 to "1" (minimum sensitivity level). Then, in Step 130, when the light of the LED 42 is not detected by the photodetection portion 53 provided inside the photodetector (for example, photo IC) 35, a signal for changing (up-shifting) the wiper terminal 33A of the digital potentiometer 33 is output to the digital potentiometer 33, and the adjustment level of the digital potentiometer 33 is set to be increased by "1" (specifically, by 1 bit).

FIG. 8 is the time chart illustrating the control signals for the digital potentiometer 33, which are transmitted from the CPU 34.

FIG. 8 illustrates the case in which the adjustment level of the digital potentiometer 33 is set to be increased by "1" (specifically, by 1 bit) and the case in which the adjustment level of the digital potentiometer 33 is set to be decreased by "1" (specifically, by 1 bit).

When the wiper terminal 33A of the digital potentiometer 33 is changed (down-shifted) in Step 140 after it is determined in Step 120 that the photodetector (for example, photo IC) 35 has detected the light of the LED 42 which is emitting the light with the maximum light amount, and it is determined in Step 130 that the photodetection portion 53 provided inside the photodetector (for example, photo IC) 35 has detected the light of the LED 42, the signal for changing (down-shifting) the wiper terminal 33A of the digital potentiometer 33 is output to the digital potentiometer 33 from the CPU 34, and the adjustment level of the digital potentiometer 33 is set to "31", which is one level down from the maximum sensitivity level of "32".

After outputting the signal for changing (down-shifting) the wiper terminal 33A of the digital potentiometer 33 to the digital potentiometer 33, and setting the adjustment level of the digital potentiometer 33 to be decreased by "1" (specifically, by 1 bit) in Step 140, it is determined in Step 150 whether or not the sensitivity adjustment (down-shift adjustment) can be performed to set the wiper terminal 33A of the digital potentiometer 33 to the adjustment level adjusted in Step 140.

Step 150 is performed for confirmation of the adjustment range. In Step 150, with the resolution set as a maximum adjustable range, the margin for adjustment is determined by confirming the number thereof.

When it is determined in Step 150 that the sensitivity adjustment (down-shift adjustment) can be performed to set the wiper terminal 33A of the digital potentiometer 33 to the adjustment level adjusted in Step 140, the processing returns to Step 130, and it is determined whether or not the light of the LED 42 is detected by the photodetection portion 53 provided inside the photodetector (for example, photo IC) 35. In other words, it is determined whether or not the state of the output from the photodetector (for example, photo IC) 35 is ON.

Then, until it is determined in Step 150 that the sensitivity adjustment (down-shift adjustment) cannot be performed to set the wiper terminal 33A of the digital potentiometer 33 to the adjustment level adjusted in Step 140, the processing of from Step 130 to Step 150 is executed repeatedly.

Further, when it is determined in Step 130 that the light of the LED 42 is not detected by the photodetection portion 53 provided inside the photodetector (for example, photo IC) 35, it is determined in Step 160 whether or not the adjustment level falls within the adjustment level range (=27 to 5) of the wiper terminal 33A of the digital potentiometer 33.

Specifically, the sensitivity adjustment (down-shift adjustment) is repeated to set the wiper terminal 33A of the digital potentiometer 33 to the adjustment level adjusted in Step 140, and when the adjustment level has reached an adjustment level at which the light of the LED 42 is not detected by the photodetection portion 53 provided inside the photodetector (for example, photo IC) 35, the processing proceeds to Step 160.

In Step 160, it is determined whether or not a range of from the adjustment level of the wiper terminal 33A of the digital potentiometer 33, which is obtained when the light of the LED 42 has been detected by the photodetector (for example, photo IC) 35 for the first time, to the adjustment level of the wiper terminal 33A of the digital potentiometer 33, which is obtained when the adjustment level has reached a level at which the light of the LED 42 is not detected by the photodetection portion 53 provided inside the photodetector (for example, photo IC) 35 (when the light amount of the LED 42 has become such a light amount that is too small for the photodetection portion 53 to detect the light), falls within the preset adjustment level range (=27 to 5) of the wiper terminal 33A of the digital potentiometer 33.

When it is determined in Step 160 that the range of from the adjustment level of the wiper terminal 33A of the digital potentiometer 33, which is obtained when the light of the LED 42 has been detected by the photodetector (for example, photo IC) 35 for the first time, to the adjustment level of the wiper terminal 33A of the digital potentiometer 33, which is obtained when the adjustment level has reached the level at which the light of the LED 42 is not detected by the photodetection portion 53 provided inside the photodetector (for example, photo IC) 35 (when the light amount of the LED 42 has become such a light amount that is too small for the photodetection portion 53 to detect the light), falls within the preset adjustment level range (=27 to 5) of the wiper terminal 33A of the digital potentiometer 33, the flow is ended.

On the other hand, the processing proceeds to Step 170 when it is determined in Step 120 that the light of the LED 42 which is emitting the light with the maximum light amount is not detected by the photodetection portion 53 provided inside the photodetector (for example, photo IC) 35, when it is determined in Step 150 that the sensitivity adjustment (down-shift adjustment) cannot be performed to set the wiper terminal 33A of the digital potentiometer 33 to the adjustment level adjusted in Step 140, or when it is determined in Step 160 that the range of from the adjustment level of the wiper terminal 33A of the digital potentiometer 33, which is obtained when the light of the LED 42 has been detected by the photodetector (for example, photo IC) 35 for the first time, to the adjustment level of the wiper terminal 33A of the digital potentiometer 33, which is obtained when the adjustment level has reached the level at which the light of the LED 42 is not detected by the photodetection portion 53 provided inside the photodetector (for example, photo IC) 35 (when the light amount of the LED 42 has become such a light amount that is too small for the photodetection portion 53 to detect the light), does not fall within the preset adjustment level range (=27 to 5) of the wiper terminal 33A of the digital potentiometer 33.

In Step 170, the CPU 34 determines that there is a trouble in adjusting the level of the wiper terminal 33A of the digital potentiometer 33, and causes the personal computer 14 connected thereto via the communication terminal unit 15 to display the result (fact that there is a trouble in adjustment).

After making an output to the effect that there is a trouble in adjusting the level of the wiper terminal 33A of the digital potentiometer 33 in Step 170, in Step 180, the adjustment level of the wiper terminal 33A of the digital potentiometer 33 is returned to the level before the start of the automatic adjustment, and the flow is then ended.

The thus set optical switch, which is provided to the indicator 4 of the converter 3 of the Coriolis flowmeter 1, performs the switching operation (ON/OFF operation) when the operation (touch operation) of touching, with a finger tip, the switching operation portion 24 or 25 of the front surface 21 of the display portion 20 is performed. With this switching operation (ON/OFF operation), the mode switching is performed.

FIG. 9 is the time chart illustrating ON/OFF determinations by means of the optical switch (photodetector).

FIG. 9 illustrates the case in which the adjustment level of the digital potentiometer 33 is set to be increased by "1" (specifically, by 1 bit) and the case in which the adjustment level of the digital potentiometer 33 is set to be decreased by "1" (specifically, by 1 bit).

Second Embodiment

Next, referring to a flow chart, description is given of an automatic correction function of the photoelectric sensing sensitivity adjusting device of the flowmeter, which is illustrated in FIG. 5.

Figure 10:
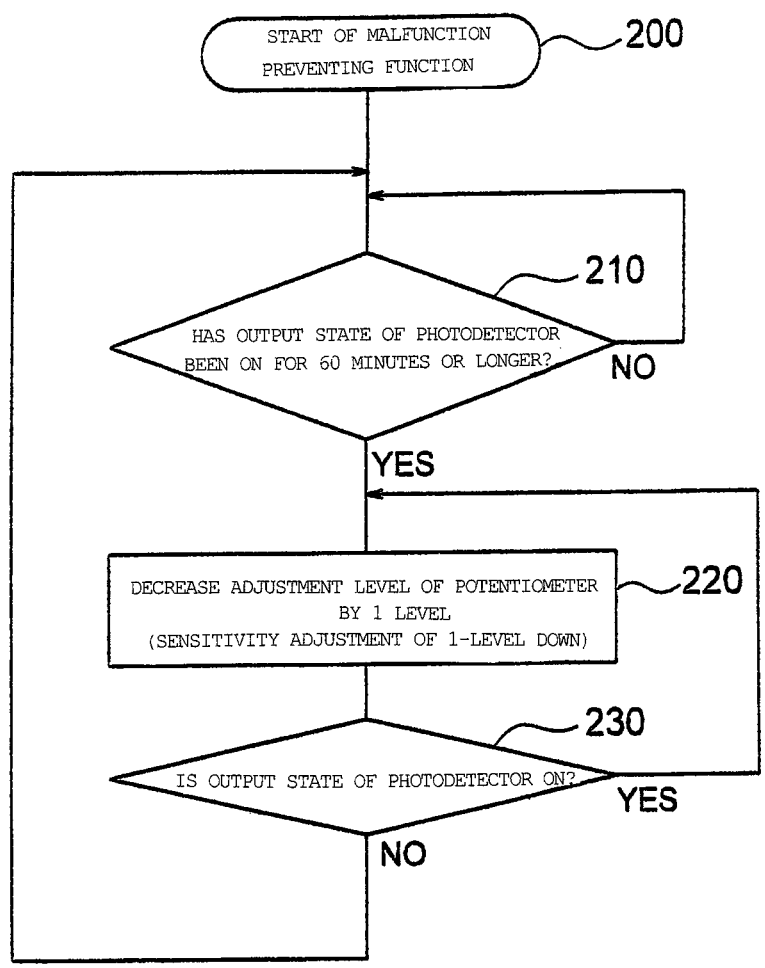
FIG. 10 is a control flow chart used when an automatic correction function of the photoelectric sensing sensitivity adjusting device of the optical-sensing non-contact switching device (SW) for a field device, which is illustrated in FIG. 5, is executed.

FIG. 10 is a control flow chart used when the automatic correction function of the photoelectric sensing sensitivity adjusting device of the flowmeter, which is illustrated in FIG. 5, is executed.

Examples of the operation which requires correction by the photoelectric sensing sensitivity adjusting device of the flowmeter include a case in which the non-contact switching device (SW) continues to be in the ON state.

Referring to FIG. 10, after the flow of the automatic correction function is started in Step 200, first, it is determined in Step 210 whether or not a given time period (for example, 60 minutes or longer) has successively elapsed after the state of the output from the photodetector (for example, photo IC) 35 became ON. In other words, in Step 210, it is determined whether or not the state of the output from the photodetector (for example, photo IC) 35 is a prolonged switch on.

When the state of the output from the photodetector (for example, photo IC) 35 is not the prolonged switch on in Step 210, the processing does not proceed until the ON state is kept successively for 60 minutes or longer after the state of the output from the photodetector (for example, photo IC) 35 becomes ON.

When it is determined in Step 210 that the state of the output from the photodetector (for example, photo IC) 35 has become the state of the prolonged switch on, in Step 220, in the case of changing (down-shifting) the wiper terminal 33A of the digital potentiometer 33, a signal for changing (down-shifting) the wiper terminal 33A of the digital potentiometer 33 is output to the digital potentiometer from the CPU 34, and the adjustment level of the digital potentiometer 33 is set to be decreased by "1" level.

Specifically, when the state of the output from the photodetector (for example, photo IC) 35 has become the state of the prolonged switch on, in Step 220, the signal for changing (down-shifting) the wiper terminal 33A of the digital potentiometer 33 is output to the digital potentiometer 33 from the CPU 34 via the digital control line 34B connecting the digital potentiometer 33 and the CPU 34, and the adjustment level of the digital potentiometer 33 is set to be decreased by "1" (specifically, by 1 bit).

As described above, in this embodiment, when it is determined that the output of the photodetector (for example, photo IC) 35 is the prolonged switch on, the signal for changing (down-shifting) the wiper terminal 33A of the digital potentiometer 33 is output to the digital potentiometer 33 from the CPU 34 via the digital control line 34B, to thereby adjust the level of the digital potentiometer 33 (decrease the level by "1" bit). Thus, the energy (voltage or current) to be supplied to the light emitter 31 from the regulator 40 for LED driving (variable output regulator provided with an output adjusting function) is controlled to adjust the light amount of the LED 42 serving as the light emitter 31.

However, instead of adjusting the light amount of the LED 42 serving as the light emitter 31 as in this embodiment, a method of adjusting the sensitivity of the photodetector (for example, photo IC) 35 may be employed. Specifically, the following control method may be employed. That is, when it is determined that the output of the photodetector (for example, photo IC) 35 is the prolonged switch on, the sensitivity of the photodetector (for example, photo IC) 35 is set to be decreased until the output of the photodetector (for example, photo IC) 35 becomes OFF.

After outputting the signal for changing (down-shifting) the wiper terminal 33A of the digital potentiometer 33 to the digital potentiometer 33 from the CPU 34, and setting the adjustment level of the digital potentiometer 33 to be decreased by "1" level in Step 220, it is determined in Step 230 whether or not the state of the output from the photodetector (for example, photo IC) 35 is ON.

In Step 230, instead of determining whether or not the state of the output from the photodetector (for example, photo IC) 35 has been ON successively for 60 minutes or longer, it is determined whether or not the state of the output from the photodetector (for example, photo IC) 35 is ON even after the adjustment level of the digital potentiometer 33 is set to be decreased by "1" level in Step 220. In other words, it is determined whether or not the level adjustment performed for the digital potentiometer 33 in Step 220 is sufficient.

Accordingly, when it is determined in Step 230 that the state of the output from the photodetector (for example, photo IC) 35 is ON, the processing returns to Step 220, and the processing of Step 220 and Step 230 is repeated until the state of the output from the photodetector (for example, photo IC) 35 becomes OFF.

In other words, in Step 220 and Step 230, when the detection sensitivity of the optical switch is too high, the level adjustment is performed for the digital potentiometer 33, and this processing is repeated until the level adjustment for the digital potentiometer 33 becomes sufficient.

When it is determined in Step 230 that the state of the output from the photodetector (for example, photo IC) 35 is not ON, that is, when it is determined that the output state is OFF, this means that the level adjustment for the digital potentiometer 33 has become sufficient, and hence this flow is ended.

With the above-mentioned configuration, according to this embodiment, the following effects are provided:

(1) digital adjustment which corresponds to the settable resolution of the digital potentiometer 33 can be performed, which facilitates simplifying the adjusting method;

(2) in contrast to conventional volume adjustment which requires a housing (jig) dedicated to adjustment, which is made by removal of part of the housing, and an actual reference of the light reflector, a large-scale adjusting jig does not need to be provided for adjustment; and (3) the optical sensitivity adjustment is controlled by the CPU 34, and hence automatic trimming can be achieved by detecting ON/OFF of the photodetection portion 34, with the result that the automatic adjustment is realized.

The invention claimed is:

1. A photoelectric sensing sensitivity adjusting device of an optical-sensing non-contact switching device (SW) for a field device, capable of performing optimum sensitivity adjustment, wherein:

a switching operation portion (man-machine interface) of the field device is configured so as not to be exposed to external air through provision of a light-emitter-beam transmissive material to a front surface thereof;

the operation portion comprising:

a switching operation portion for turning on/off a photoelectric sensor by bringing a light reflector closer to the front surface formed of the light-emitter-beam transmissive material;

a data display screen for displaying a screen according to a switching mode designated by the switching operation portion, after a switching operation (ON operation) of the switching operation portion is performed by bringing the light reflector closer to the front surface of the operation portion to thereby switch modes of display data including a setting; and a photoelectric sensing sensitivity adjusting device for adjusting optical detection sensitivity of the photoelectric sensor which is turned on/off by the switching operation portion, the photoelectric sensing sensitivity adjusting device comprising:

a light emitter including an LED, for emitting light by being supplied with energy (current or voltage);

a regulator for LED driving with an output adjusting function, for supplying the energy (current or voltage) to the LED serving as the light emitter;

a light receiving device for receiving the light which is emitted from the light emitter and reflected by bringing the light reflector closer to the front surface formed of the light-emitter-beam transmissive material;

a digital potentiometer for controlling increase or decrease of the energy (current or voltage) to be supplied to the LED serving as the light emitter from the regulator for LED driving;

a CPU for digitally controlling the increase or decrease of the energy (current or voltage) to be supplied to the LED serving as the light emitter from the regulator for LED driving, by controlling the digital potentiometer according to a software control program with a control signal;

a personal computer connected via a communication terminal unit, for controlling the CPU; and a photodetection portion for detecting an optical signal emitted from the LED, converting the optical signal to an electrical signal, and outputting the electrical signal.

2. The photoelectric sensing sensitivity adjusting device of an optical-sensing non-contact switching device (SW) for a field device according to claim 1, wherein the field device is accommodated in a sturdy housing intended for on-site installation in consideration of durability.

3. The photoelectric sensing sensitivity adjusting device of an optical-sensing non-contact switching device (SW) for a field device according to claim 1, wherein the CPU executes an automatic sensitivity adjustment function for optical sensing including:

resetting a current adjustment level of the digital potentiometer to set an adjustment level of the digital potentiometer to a maximum sensitivity level;

determining whether or not the light of the LED which is emitting the light under a state of the resetting of the current adjustment level is detected by the photodetection portion provided inside a photodetector;

outputting, when the light of the LED is detected by the photodetection portion, a signal for changing (up-shifting or down-shifting) a wiper terminal of the digital potentiometer to the digital potentiometer from the CPU via a digital control line connecting the digital potentiometer and the CPU, and setting the adjustment level of the digital potentiometer to be increased or decreased by "1" (by 1 bit);

determining whether or not sensitivity of the wiper terminal of the digital potentiometer can be adjusted (up-shifted or down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is increased in a stepwise manner, and the adjustment is ended at a level at which an output from the photodetector is changed.

4. The photoelectric sensing sensitivity adjusting device of an optical-sensing non-contact switching device (SW) for a field device according to claim 1, wherein the CPU executes an automatic correction function for an optical switch, including:

determining whether or not a long period of time has successively elapsed after a state of output from the photodetector became ON;

determining that there is a malfunction when an ON state has been kept successively for the long period of time after the state of the output from the detector became ON, outputting a signal for changing (down-shifting) the wiper terminal to the digital potentiometer from the CPU, and setting the sensitivity adjustment level of the photodetector to be decreased by "1" level;

determining whether or not the state of the output from the photodetector is ON even after the sensitivity adjustment level of the photodetector is set to be decreased by the "1" level;

controlling the sensitivity adjustment level of the photodetector until the state of the output from the photodetector becomes OFF after determining that the sensitivity adjustment level of the photodetector is continuously high because the state of the output from the photodetector is ON; and when the state of the output from the photodetector becomes OFF, determining that the sensitivity adjustment level of the photodetector has become appropriate, and ending controlling of the sensitivity adjustment level of the photodetector, wherein the adjusted sensitivity of the optical switch is decreased in a stepwise manner, and the adjustment is ended at the level at which the output from the photodetector is changed, thereby automatically correcting the sensitivity adjustment of the optical switch.

5. A photoelectric sensing sensitivity adjusting device of an optical-sensing non-contact switching device (SW) for a field device, capable of performing optimum sensitivity adjustment through control of a digital potentiometer by a CPU, wherein:

a switching operation portion (man-machine interface) of the field device is configured so as not to be exposed to external air through provision of a light-emitter-beam transmissive material to a front surface thereof;

the switching operation portion being configured so as not to be exposed to external air with provision of a light-emitter-beam transmissive material to a front surface thereof, the switching operation portion comprising:

a switching operation portion for turning on/off a photoelectric sensor comprising a light emitter and a photodetector, by bringing a light reflector closer to the light-emitter-beam transmissive material;

a data display screen for displaying, on a screen, according to a designated mode, a mode of display data through a switching operation of the switching operation portion; and a photoelectric sensing sensitivity adjusting device adjusting optical detection sensitivity of the photoelectric sensor, the photoelectric sensing sensitivity adjusting device comprising:
an LED;
a photo IC;
a variable output regulator;
a digital potentiometer; and
a CPU, wherein the LED emits light by being supplied with electrical energy, wherein the photo IC receives the light which is emitted from the LED and reflected by the light reflector, and outputs a signal, wherein the variable output regulator has one end connected to the LED via a first resistor and another end connected to the digital potentiometer via a second resistor, and increases or decreases a forward current of the LED by changing an output voltage, to thereby adjust a light emission amount of the LED, wherein the digital potentiometer controls the output voltage of the variable output regulator, to thereby control energy (voltage or current) to be supplied to the LED from the variable output regulator, and wherein the CPU transmits a control signal to the digital potentiometer to control the output voltage of the variable output regulator, thereby adjusting the light emission amount of the LED by controlling the energy (voltage or current) to be supplied to the LED from the variable output regulator.

6. The photoelectric sensing sensitivity adjusting device of an optical-sensing non-contact switching device (SW) for a field device according to claim 5, wherein the photo IC comprises:
a photodetection portion;
a pulse generator;
an AND circuit; and
a transistor, wherein the photodetection portion detects the light which is emitted from the LED and reflected by the light reflector, and outputs a received optical signal to one terminal of the AND circuit when the light has a given light amount or more, wherein the pulse generator outputs a given pulse signal to cause the LED to emit the light in synchronization with the given pulse signal by using the given pulse signal, and inputs the given pulse signal to another terminal of the AND circuit, wherein the AND circuit performs an AND operation between the received optical signal, which is output after the light emitted from the LED is received, and the given pulse signal output from the pulse generator, and outputs a resultant to the CPU, and wherein the transistor is turned on/off by the given pulse signal output from the pulse generator so as to cause the LED to emit the light in synchronization with the given pulse signal.

7. The photoelectric sensing sensitivity adjusting device of an optical-sensing non-contact switching device (SW) for a field device according to claim 5, wherein the digital potentiometer comprises a wiper terminal provided with an adjustment level corresponding to 32 bits, and wherein, by using a CS signal specifying a target device, an UP/DOWN signal for determining whether the adjustment level of the digital potentiometer is to be increased or decreased, and a signal (counter signal) for shifting the adjustment level of the digital potentiometer every time a pulse edge is detected, which are output via digital control lines from a PIO built in the CPU, the digital potentiometer controls, according to the adjustment level, a connecting location of a wiper terminal of the variable output regulator to change a resistance value of the second resistor connected to the another end of the variable output regulator, and controls a resistance-divided voltage ratio between the second resistor and the first resistor which is connected to the one end of the variable output regulator, thereby controlling the output voltage (or current) to be supplied to the LED from the variable output regulator.

8. The photoelectric sensing sensitivity adjusting device of an optical-sensing non-contact switching device (SW) for a field device according to claim 7, wherein the CPU executes a software program so as to:

determine, based on an input of an output signal output from the AND circuit of the photo IC, whether or not the light has been emitted from the LED;

until the photodetection portion of the photo IC detects reflection light obtained when the light emitted from the LED is reflected by the light reflector, sequentially control, according to the adjustment level corresponding to 32 bits, a connecting location of the wiper terminal of the digital potentiometer by using the CS signal specifying the target device, the UP/DOWN signal for determining whether the adjustment level of the digital potentiometer is to be increased or decreased, and the signal (counter signal) for shifting the adjustment level of the digital potentiometer every time the pulse edge is detected, which are output via the digital control lines from the PIO built in the CPU; and control the resistance-divided voltage ratio between the first resistor connected to the one end of the variable output regulator and the second resistor connected to the another end of the variable output regulator, thereby controlling the output voltage (or current) to be supplied to the LED from the variable output regulator.

9. The photoelectric sensing sensitivity adjusting device of an optical-sensing non-contact switching device (SW) for a field device according to claim 5, wherein the CPU executes an automatic sensitivity adjustment function for optical sensing including:

resetting a current adjustment level of the digital potentiometer to set an adjustment level of the digital potentiometer to a maximum sensitivity level;

determining whether or not the light of the LED which is emitting the light under a state of the resetting of the current adjustment level is detected by the photodetection portion provided inside the photodetector;

outputting, when the light of the LED is detected by the photodetection portion, a signal for changing (down-shifting) the wiper terminal of the digital potentiometer to the digital potentiometer from the CPU via the digital control line connecting the digital potentiometer and the CPU, and setting the adjustment level of the digital potentiometer to be decreased by "1" (by 1 bit);

determining whether or not sensitivity of the wiper terminal of the digital potentiometer can be adjusted (down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is decreased or increased in a stepwise manner, and the adjustment is ended at a level at which an output from the photodetector is changed.

10. The photoelectric sensing sensitivity adjusting device of an optical-sensing non-contact switching device (SW) for a field device according to claim 5, wherein the CPU executes an automatic correction function for an optical switch, including:
determining whether or not a long period of time has successively elapsed after a state of output from the photodetector became ON;
determining that there is a malfunction when an ON state has been kept successively for the long period of time after the state of the output from the detector became ON, outputting a signal for changing (down-shifting) the wiper terminal to the digital potentiometer from the CPU, and setting the sensitivity adjustment level of the photodetector to be decreased by "1" level;
determining whether or not the state of the output from the photodetector is ON even after the sensitivity adjustment level of the photodetector is set to be decreased by the "1" level;
controlling the sensitivity adjustment level of the photodetector until the state of the output from the photodetector becomes OFF after determining that the sensitivity adjustment level of the photodetector is continuously high because the state of the output from the photodetector is ON; and
when the state of the output from the photodetector becomes OFF, determining that the sensitivity adjustment level of the photodetector has become appropriate, and ending controlling of the sensitivity adjustment level of the photodetector,
wherein the adjusted sensitivity of the optical switch is decreased in a stepwise manner, and the adjustment is ended at the level at which the output from the photodetector is changed, thereby automatically correcting the sensitivity adjustment of the optical switch.

11. The photoelectric sensing sensitivity adjusting device of an optical-sensing non-contact switching device (SW) for a field device according to claim 2, wherein the CPU executes an automatic sensitivity adjustment function for optical sensing including:
resetting a current adjustment level of the digital potentiometer to set an adjustment level of the digital potentiometer to a maximum sensitivity level;
determining whether or not the light of the LED which is emitting the light under a state of the resetting of the current adjustment level is detected by the photodetection portion provided inside a photodetector;
outputting, when the light of the LED is detected by the photodetection portion, a signal for changing (up-shifting or down-shifting) a wiper terminal of the digital potentiometer to the digital potentiometer from the CPU via a digital control line connecting the digital potentiometer and the CPU, and setting the adjustment level of the digital potentiometer to be increased or decreased by "1" (by 1 bit);
determining whether or not sensitivity of the wiper terminal of the digital potentiometer can be adjusted (up-shifted or down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is increased in a stepwise manner, and the adjustment is ended at a level at which an output from the photodetector is changed.

12. The photoelectric sensing sensitivity adjusting device of an optical-sensing non-contact switching device (SW) for a field device according to claim 2, wherein the CPU executes an automatic correction function for an optical switch, including:
determining whether or not a long period of time has successively elapsed after a state of output from the photodetector became ON;
determining that there is a malfunction when an ON state has been kept successively for the long period of time after the state of the output from the detector became ON, outputting a signal for changing (down-shifting) the wiper terminal to the digital potentiometer from the CPU, and setting the sensitivity adjustment level of the photodetector to be decreased by "1" level;
determining whether or not the state of the output from the photodetector is ON even after the sensitivity adjustment level of the photodetector is set to be decreased by the "1" level;
controlling the sensitivity adjustment level of the photodetector until the state of the output from the photodetector becomes OFF after determining that the sensitivity adjustment level of the photodetector is continuously high because the state of the output from the photodetector is ON; and
when the state of the output from the photodetector becomes OFF, determining that the sensitivity adjustment level of the photodetector has become appropriate, and ending controlling of the sensitivity adjustment level of the photodetector,
wherein the adjusted sensitivity of the optical switch is decreased in a stepwise manner, and the adjustment is ended at the level at which the output from the photodetector is changed, thereby automatically correcting the sensitivity adjustment of the optical switch.

13. The photoelectric sensing sensitivity adjusting device of an optical-sensing non-contact switching device (SW) for a field device according to claim 3, wherein the CPU executes an automatic correction function for an optical switch, including:
determining whether or not a long period of time has successively elapsed after a state of output from the photodetector became ON;
determining that there is a malfunction when an ON state has been kept successively for the long period of time after the state of the output from the detector became ON, outputting a signal for changing (down-shifting) the wiper terminal to the digital potentiometer from the CPU, and setting the sensitivity adjustment level of the photodetector to be decreased by "1" level;
determining whether or not the state of the output from the photodetector is ON even after the sensitivity adjustment level of the photodetector is set to be decreased by the "1" level;
controlling the sensitivity adjustment level of the photodetector until the state of the output from the photodetector becomes OFF after determining that the sensitivity adjustment level of the photodetector is continuously high because the state of the output from the photodetector is ON; and when the state of the output from the photodetector becomes OFF, determining that the sensitivity adjustment level of the photodetector has become appropriate, and ending controlling of the sensitivity adjustment level of the photodetector, wherein the adjusted sensitivity of the optical switch is decreased in a stepwise manner, and the adjustment is ended at the level at which the output from the photodetector is changed, thereby automatically correcting the sensitivity adjustment of the optical switch.

14. The photoelectric sensing sensitivity adjusting device of an optical-sensing non-contact switching device (SW) for a field device according to claim 6, wherein the digital potentiometer comprises a wiper terminal provided with an adjustment level corresponding to 32 bits, and wherein, by using a CS signal specifying a target device, an UP/DOWN signal for determining whether the adjustment level of the digital potentiometer is to be increased or decreased, and a signal (counter signal) for shifting the adjustment level of the digital potentiometer every time a pulse edge is detected, which are output via digital control lines from a PIO built in the CPU, the digital potentiometer controls, according to the adjustment level, a connecting location of a wiper terminal of the variable output regulator to change a resistance value of the second resistor connected to the another end of the variable output regulator, and controls a resistance-divided voltage ratio between the second resistor and the first resistor which is connected to the one end of the variable output regulator, thereby controlling the output voltage (or current) to be supplied to the LED from the variable output regulator.

15. The photoelectric sensing sensitivity adjusting device of an optical-sensing non-contact switching device (SW) for a field device according to claim 6, wherein the CPU executes an automatic sensitivity adjustment function for optical sensing including:

resetting a current adjustment level of the digital potentiometer to set an adjustment level of the digital potentiometer to a maximum sensitivity level;

determining whether or not the light of the LED which is emitting the light under a state of the resetting of the current adjustment level is detected by the photodetection portion provided inside the photodetector;

outputting, when the light of the LED is detected by the photodetection portion, a signal for changing (down-shifting) the wiper terminal of the digital potentiometer to the digital potentiometer from the CPU via the digital control line connecting the digital potentiometer and the CPU, and setting the adjustment level of the digital potentiometer to be decreased by "1" (by 1 bit);

determining whether or not sensitivity of the wiper terminal of the digital potentiometer can be adjusted (down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is decreased or increased in a stepwise manner, and the adjustment is ended at a level at which an output from the photodetector is changed.

16. The photoelectric sensing sensitivity adjusting device of an optical-sensing non-contact switching device (SW) for a field device according to claim 7, wherein the CPU executes an automatic sensitivity adjustment function for optical sensing including:

resetting a current adjustment level of the digital potentiometer to set an adjustment level of the digital potentiometer to a maximum sensitivity level;

determining whether or not the light of the LED which is emitting the light under a state of the resetting of the current adjustment level is detected by the photodetection portion provided inside the photodetector;

outputting, when the light of the LED is detected by the photodetection portion, a signal for changing (down-shifting) the wiper terminal of the digital potentiometer to the digital potentiometer from the CPU via the digital control line connecting the digital potentiometer and the CPU, and setting the adjustment level of the digital potentiometer to be decreased by "1" (by 1 bit);

determining whether or not sensitivity of the wiper terminal of the digital potentiometer can be adjusted (down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is decreased or increased in a stepwise manner, and the adjustment is ended at a level at which an output from the photodetector is changed.

17. The photoelectric sensing sensitivity adjusting device of an optical-sensing non-contact switching device (SW) for a field device according to claim 8, wherein the CPU executes an automatic sensitivity adjustment function for optical sensing including:

resetting a current adjustment level of the digital potentiometer to set an adjustment level of the digital potentiometer to a maximum sensitivity level;

determining whether or not the light of the LED which is emitting the light under a state of the resetting of the current adjustment level is detected by the photodetection portion provided inside the photodetector;

outputting, when the light of the LED is detected by the photodetection portion, a signal for changing (down-shifting) the wiper terminal of the digital potentiometer to the digital potentiometer from the CPU via the digital control line connecting the digital potentiometer and the CPU, and setting the adjustment level of the digital potentiometer to be decreased by "1" (by 1 bit);

determining whether or not sensitivity of the wiper terminal of the digital potentiometer can be adjusted (down-shifted) to fall within an adjustment level range; and when the sensitivity can be adjusted to fall within the adjustment range, determining whether or not the adjustment level falls within the adjustment level range (=27 to 5) of the wiper terminal of the digital potentiometer, wherein the adjusted sensitivity of the photoelectric sensor is decreased or increased in a stepwise manner, and the adjustment is ended at a level at which an output from the photodetector is changed.

18. The photoelectric sensing sensitivity adjusting device of an optical-sensing non-contact switching device (SW) for a field device according to claim 6, wherein the CPU executes an automatic correction function for an optical switch, including:
  determining whether or not a long period of time has successively elapsed after a state of output from the photodetector became ON;
  determining that there is a malfunction when an ON state has been kept successively for the long period of time after the state of the output from the detector became ON, outputting a signal for changing (downshifting) the wiper terminal to the digital potentiometer from the CPU, and setting the sensitivity adjustment level of the photodetector to be decreased by "1" level;
  determining whether or not the state of the output from the photodetector is ON even after the sensitivity adjustment level of the photodetector is set to be decreased by the "1" level;
  controlling the sensitivity adjustment level of the photodetector until the state of the output from the photodetector becomes OFF after determining that the sensitivity adjustment level of the photodetector is continuously high because the state of the output from the photodetector is ON; and
  when the state of the output from the photodetector becomes OFF, determining that the sensitivity adjustment level of the photodetector has become appropriate, and ending controlling of the sensitivity adjustment level of the photodetector,
wherein the adjusted sensitivity of the optical switch is decreased in a stepwise manner, and the adjustment is ended at the level at which the output from the photodetector is changed, thereby automatically correcting the sensitivity adjustment of the optical switch.

19. The photoelectric sensing sensitivity adjusting device of an optical-sensing non-contact switching device (SW) for a field device according to claim 7, wherein the CPU executes an automatic correction function for an optical switch, including:
  determining whether or not a long period of time has successively elapsed after a state of output from the photodetector became ON;
  determining that there is a malfunction when an ON state has been kept successively for the long period of time after the state of the output from the detector became ON, outputting a signal for changing (downshifting) the wiper terminal to the digital potentiometer from the CPU, and setting the sensitivity adjustment level of the photodetector to be decreased by "1" level;
  determining whether or not the state of the output from the photodetector is ON even after the sensitivity adjustment level of the photodetector is set to be decreased by the "1" level;
  controlling the sensitivity adjustment level of the photodetector until the state of the output from the photodetector becomes OFF after determining that the sensitivity adjustment level of the photodetector is continuously high because the state of the output from the photodetector is ON; and
  when the state of the output from the photodetector becomes OFF, determining that the sensitivity adjustment level of the photodetector has become appropriate, and ending controlling of the sensitivity adjustment level of the photodetector,
wherein the adjusted sensitivity of the optical switch is decreased in a stepwise manner, and the adjustment is ended at the level at which the output from the photodetector is changed, thereby automatically correcting the sensitivity adjustment of the optical switch.

20. The photoelectric sensing sensitivity adjusting device of an optical-sensing non-contact switching device (SW) for a field device according to claim 8, wherein the CPU executes an automatic correction function for an optical switch, including:
  determining whether or not a long period of time has successively elapsed after a state of output from the photodetector became ON;
  determining that there is a malfunction when an ON state has been kept successively for the long period of time after the state of the output from the detector became ON, outputting a signal for changing (downshifting) the wiper terminal to the digital potentiometer from the CPU, and setting the sensitivity adjustment level of the photodetector to be decreased by "1" level;
  determining whether or not the state of the output from the photodetector is ON even after the sensitivity adjustment level of the photodetector is set to be decreased by the "1" level;
  controlling the sensitivity adjustment level of the photodetector until the state of the output from the photodetector becomes OFF after determining that the sensitivity adjustment level of the photodetector is continuously high because the state of the output from the photodetector is ON; and
  when the state of the output from the photodetector becomes OFF, determining that the sensitivity adjustment level of the photodetector has become appropriate, and ending controlling of the sensitivity adjustment level of the photodetector,
wherein the adjusted sensitivity of the optical switch is decreased in a stepwise manner, and the adjustment is ended at the level at which the output from the photodetector is changed, thereby automatically correcting the sensitivity adjustment of the optical switch.

* * * * *